US012462748B2

(12) United States Patent
Jung et al.

(10) Patent No.: US 12,462,748 B2
(45) Date of Patent: Nov. 4, 2025

(54) DISPLAY PANEL AND DISPLAY DEVICE INCLUDING THE SAME CONTROLLING A CLOCK SIGNAL INPUT TO A GATE DRIVER

(71) Applicant: LG Display Co., Ltd., Seoul (KR)

(72) Inventors: Bo Yun Jung, Paju-si (KR); Dong Gun Lee, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 112 days.

(21) Appl. No.: 18/382,937

(22) Filed: Oct. 23, 2023

(65) Prior Publication Data

US 2024/0212612 A1 Jun. 27, 2024

(30) Foreign Application Priority Data

Dec. 27, 2022 (KR) ........................ 10-2022-0185865

(51) Int. Cl.
*G09G 3/3233* (2016.01)
*G09G 3/20* (2006.01)
*G11C 19/28* (2006.01)

(52) U.S. Cl.
CPC ......... *G09G 3/3233* (2013.01); *G09G 3/2096* (2013.01); *G11C 19/287* (2013.01); *G09G 2300/0819* (2013.01); *G09G 2300/0842* (2013.01); *G09G 2310/0213* (2013.01); *G09G 2310/0286* (2013.01); *G09G 2310/04* (2013.01); *G09G 2310/08* (2013.01); *G09G 2330/021* (2013.01); *G09G 2370/10* (2013.01)

(58) Field of Classification Search
CPC .................................................... G09G 3/3233
See application file for complete search history.

(56) References Cited

U.S. PATENT DOCUMENTS

2017/0098413 A1* 4/2017 Lee ..................... G09G 3/3233

FOREIGN PATENT DOCUMENTS

KR 10-2012-0044681 A 5/2012
KR 10-2019-0061279 A 6/2019
KR 10-2021-0144400 A 11/2021

* cited by examiner

*Primary Examiner* — Gustavo Polo
(74) *Attorney, Agent, or Firm* — Birch, Stewart, Kolasch & Birch, LLP

(57) ABSTRACT

A display panel and a display device including the same are discussed. The display panel includes a display area in which a plurality of data lines, a plurality of gate lines, and a plurality of sub-pixels are disposed, and a gate driver configured to supply gate signals to the gate lines. The display area includes a high-speed driving area, and a low-speed driving area driven at a frequency lower than that of the high-speed driving area. One cycle of a clock signal input to the gate driver includes a high interval with a gate high voltage and a low interval with a gate low voltage. A high interval of the clock signal is longer than a high interval of the high-speed driving area at a scanning time point of a first pixel line from which scanning of the low-speed driving area is started.

19 Claims, 21 Drawing Sheets

DISPLAY PANEL AND DISPLAY DEVICE INCLUDING THE SAME CONTROLLING A CLOCK SIGNAL INPUT TO A GATE DRIVER

CROSS-REFERENCE TO RELATED APPLICATION

This application claims priority to Korean Patent Application No. 10-2022-0185865, filed in the Republic of Korea on Dec. 27, 2022, the entire contents of which is hereby expressly incorporated by reference into the present application.

BACKGROUND

1. Field

The present disclosure relates to a display panel with reduced power consumption and a display device including the same.

2. Discussion of Related Art

An organic light-emitting display device includes an organic light-emitting diode (hereinafter referred to as "OLED") which emits light by itself, and has an advantage that its response speed is fast and its luminous efficiency, luminance, and viewing angle are large. The organic light-emitting display device has a fast response speed, excellent luminous efficiency, luminance, and viewing angle, and has excellent contrast ratio and color reproducibility since it can express black grayscales in full black.

Further, the organic light-emitting display device does not require a backlight unit, and can be implemented on a plastic substrate, a thin glass substrate, or a metal substrate, which is a flexible material. Accordingly, flexible displays can be implemented in the organic light-emitting display devices.

Various research efforts are being conducted to reduce power consumption in an organic light-emitting display device.

SUMMARY OF THE DISCLOSURE

The embodiments of the present disclosure are directed to address the aforementioned needs and limitations associated with the related art.

The embodiments of the present disclosure provide a display panel capable of reducing power consumption and a display device including the same.

It should be noted that objects of the present disclosure are not limited to the above-described objects, and other objects of the present disclosure will be apparent to those skilled in the art from the following descriptions.

A display panel according to one embodiment of the present disclosure can include a display area in which a plurality of data lines, a plurality of gate lines, and a plurality of sub-pixels are disposed; and a gate driver disposed in a non-display area outside the display area to supply gate signals to the gate lines. The display area can include a high-speed driving area configured to be driven at a frequency (e.g., first frequency) and a low-speed driving area driven at a frequency (e.g., second frequency) lower than the frequency (first frequency) of the high-speed driving area. One cycle of a clock (clock signal) input to the gate driver includes a high interval with a gate high voltage and a low interval with a gate low voltage. The high interval of the clock can be longer than a high interval of the high-speed driving area at a scanning time point of a first pixel line from which scanning of the low-speed driving area is started.

The high interval of the clock can be the same as the high interval of the high-speed driving area after the scanning time point of the first pixel line from which scanning of the low-speed driving area is started.

The gate driver can be disposed in a non-display area located outside the display area.

Each of the sub-pixels can include a driving element including a gate electrode connected to a first node, a first electrode connected to a second node, and a second electrode connected to a third node; a capacitor connected between a first constant voltage node to which a pixel driving voltage is applied and the first node; a light emitting element including an anode electrode connected to a fourth node and a cathode electrode connected to a second constant voltage node to which a pixel base voltage is applied; a first switch element including a gate electrode to which a first gate signal is applied, a first electrode connected to the first node, and a second electrode connected to the third node; a second switch element including a gate electrode to which a second gate signal is applied, a first electrode connected to a data line, and a second electrode connected to the second node; a third switch element including a gate electrode to which a fifth gate signal is applied, a first electrode connected to the first constant voltage node, and a second electrode connected to the second node; a fourth switch element including a gate electrode to which the fifth gate signal is applied, a first electrode connected to the third node, and a second electrode connected to the fourth node; a fifth switch element including a gate electrode to which a fourth gate signal is applied, a first electrode connected to the first node, and a second electrode to which a first initialization voltage is applied; a sixth switch element including a gate electrode to which a third gate signal is applied, a first electrode connected to the fourth node, and a second electrode to which a second initialization voltage is applied; and a seventh switch element including a gate electrode to which the third gate signal is applied, a first electrode connected to the second node, and a second electrode to which an on-bias voltage is applied. The first gate signal and the fourth gate signal can swing between a gate-high voltage and a gate-low voltage during a scanning period of the high-speed driving area and maintain the gate-low voltage during a scanning period of the low-speed driving area.

The gate driver can include a first shift register configured to output the first gate signal; a second shift register configured to output the second gate signal; a third shift register configured to output the third gate signal; a fourth shift register configured to output the fourth gate signal; and a fifth shift register configured to output the fifth gate signal. Each of the first to fifth shift registers can include a VST node (also referred to herein as a signal node) to which a start pulse or carry signal is inputted and a CLK node (also referred to herein as a clock node) to which the clock is inputted. The high interval of the clock inputted to the first and fourth shift registers can maintain a previous voltage at a scanning time point of a first pixel line from which scanning of the low-speed driving area is started.

Each of the first and fourth shift registers can include a left circuit disposed in a left non-display area of the display panel, and a right circuit disposed in a right non-display area of the display panel. The left circuit can include a plurality of signal transmitters configured to include a VST node and a CLK node and output gate signals to left ends of gate lines. The right circuit can include a plurality of signal transmitters configured to include a VST node and a CLK node and output gate signals to right ends of the other gate lines. A carry signal can be transmitted between the signal transmitters of the left circuit and the signal transmitters of the right circuit.

Each of the sub-pixels can include a driving element including a gate electrode connected to a first node, a first electrode connected to a second node, and a second electrode connected to a third node; a capacitor connected between a first constant voltage node to which a pixel driving voltage is applied and the first node; a light emitting element including an anode electrode connected to a fourth node and a cathode electrode connected to a second constant voltage node to which a pixel base voltage is applied; a first switch element including a gate electrode to which a third gate signal is applied, a first electrode connected to the first constant voltage node, and a second electrode connected to the second node; a second switch element including a gate electrode to which a second gate signal is applied, a first electrode connected to a data line, and a second electrode connected to the second node; a third switch element including a gate electrode to which a first gate signal is applied, a first electrode connected to the first node, and a second electrode to which an initialization voltage is applied; a fourth switch element including a gate electrode to which the second gate signal is applied, a first electrode connected to the first node, and a second electrode connected to the third node; and a fifth switch element including a gate electrode to which the third gate signal is applied, a first electrode connected to the third node, and a second electrode connected to the fourth node. The first gate signal and the second gate signal can swing between a gate-high voltage and a gate-low voltage during a scanning period of the high-speed driving area and maintain the gate-high voltage during a scanning period of the low-speed driving area.

The gate driver can include a first shift register configured to output the first gate signal; a second shift register configured to output the second gate signal; and a third shift register configured to output the third gate signal. Each of the first to third shift registers can include a VST node to which a start pulse or carry signal is inputted and a CLK node to which the clock is inputted. The high interval of the clock inputted to the first and second shift registers can maintain a previous voltage at a scanning time point of a first pixel line from which scanning of the low-speed driving area is started.

Each of the first and second shift registers can include: a left circuit disposed in a left non-display area of the display panel; and a right circuit disposed in a right non-display area of the display panel. The left circuit can include a plurality of signal transmitters configured to include a VST node and a CLK node, and output gate signals to left ends of gate lines. The right circuit can include a plurality of signal transmitters configured to include a VST node and a CLK node, and output gate signals to right ends of other gate lines. A carry signal can be transmitted between the signal transmitters of the left circuit and the signal transmitters of the right circuit.

A display device according to one embodiment of the present disclosure can include a display panel including a display area in which a plurality of data lines, a plurality of gate lines, a plurality of sub-pixels are disposed, and a gate driver configured to supply gate signals to the gate lines; and a drive IC configured to supply data voltages to the data lines. The display area includes: a high-speed driving area; and a low-speed driving area driven at a frequency lower than the frequency of the high-speed driving area. One cycle of a clock signal input to the gate driver includes a high interval with a gate high voltage and a low interval with a gate low voltage. A high interval of the clock is longer than a high interval of the high-speed driving area at a scanning time point of a first pixel line from which the scanning of the low-speed driving area is started.

The drive IC can receive control data packets and pixel data to be written to one pixel line of the display area from a host system every horizontal period. The control data packet can include an identification code indicating that pixel data to be written to the one pixel line is data in one of the high-speed driving area or data in the low-speed driving area.

According to the present disclosure, a display area in which a pixel array is disposed can be divided and driven into a high-speed driving area and a low-speed driving area within a one-frame period, and light emission can be maintained at a data voltage charged in a previous frame period in the low-speed driving area to reduce consuming power. Accordingly, the present disclosure can implement a display device capable of low power driving.

According to the present disclosure, an image can be displayed without applying a data voltage to a pixel circuit of a low-speed driving area by modulating an input clock of a gate driver.

According to the present invention, the position and size of each of the high-speed driving area and the low-speed driving area can be freely adjusted by modulating the clock input to the gate driver.

Effects which can be achieved by the present disclosure are not limited to the above-mentioned effects. For example, other objects that are not mentioned can be obviously understood by those skilled in the art to which the present disclosure pertains from the following description.

BRIEF DESCRIPTION OF THE DRAWINGS

The above and other objects, features, and advantages of the present disclosure will become more apparent to those of ordinary skill in the art by describing exemplary embodiments thereof in detail with reference to the attached drawings, in which.

DETAILED DESCRIPTION OF THE EMBODIMENTS

Figure 1:
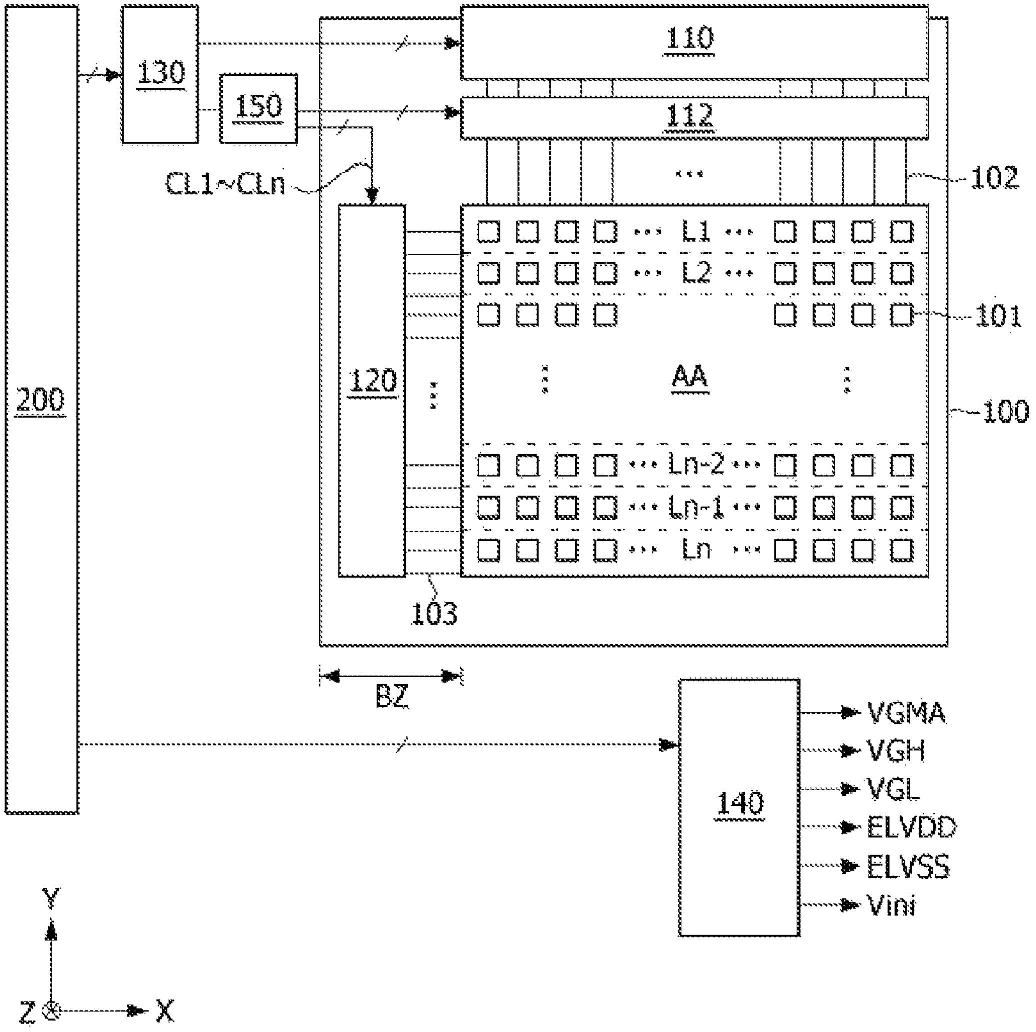
FIG. 1 is a block diagram showing a display device according to one embodiment of the present disclosure.

The advantages and features of the present disclosure and methods for accomplishing the same will be more clearly understood from embodiments described below with reference to the accompanying drawings. However, the present disclosure is not limited to the following embodiments but can be implemented in various different forms. Rather, the present embodiments will make the disclosure of the present disclosure complete and allow those skilled in the art to completely comprehend the scope of the present disclosure. The present disclosure can be defined within the scope of the accompanying claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies can be omitted to avoid unnecessarily obscuring the subject matter of the present disclosure.

The terms such as "comprising," "including," "having," and "consist of" used herein are generally intended to allow other components to be added unless the terms are used with the term "only." Any references to singular can include plural unless expressly stated otherwise.

Components are interpreted to include an ordinary error range even if not expressly stated.

When a positional or interconnected relationship is described between two components, such as "on top of," "on," "over," "above," "below," "next to," "connect or couple with," "crossing," "intersecting," or the like, one or more other components can be interposed between them, unless "immediately" or "directly" is used.

When a temporal antecedent relationship is described, such as "after", "following", "next to", "before", or the like, it may not be continuous on a time base unless "immediately" or "directly" is used.

The terms "first," "second," and the like can be used to distinguish components from each other, but the functions or structures of the components are not limited by ordinal numbers or component names in front of the components and may not define order or sequence. Further, the terms "left" and "right" refer to two generally opposing sides and can be different sides (e.g., top and bottom, or first and second or vice versa) depending on the orientation of the device or the reference point.

The following embodiments can be partially or entirely bonded to or combined with each other and can be linked and operated in technically various ways. The embodiments can be carried out independently of or in association with each other.

In a display device of the present disclosure, a pixel circuit and a gate driving circuit can include a plurality of transistors. Transistors can be implemented as oxide thin film transistors (oxide TFTs) including an oxide semiconductor, low temperature polysilicon (LTPS) TFTs including low temperature polysilicon, or the like. Further, each of the transistors can be implemented as a p-channel TFT or an n-channel TFT.

A transistor is a three-electrode element including a gate, a source, and a drain. The source is an electrode that supplies carriers to the transistor. In the transistor, carriers start to flow from the source. The drain is an electrode through which carriers exit from the transistor. In a transistor, carriers flow from a source to a drain. In the case of an n-channel transistor, since carriers are electrons, a source voltage is a voltage lower than a drain voltage such that electrons can flow from a source to a drain. The n-channel transistor has a direction of a current flowing from the drain to the source. In the case of a p-channel transistor (p-channel metal-oxide semiconductor (PMOS)), since carriers are holes, a source voltage is higher than a drain voltage such that holes can flow from a source to a drain. In the p-channel transistor, since holes flow from the source to the drain, a current flows from the source to the drain. It should be noted that a source and a drain of a transistor are not fixed. For example, a source and a drain can be changed according to an applied voltage. Therefore, the disclosure is not limited to a source and a drain of a transistor. In the following description, a source and a drain of a transistor will be referred to as a first electrode and a second electrode.

A gate signal can swing between a gate-on voltage and a gate-off voltage. The transistor is turned on in response to the gate-on voltage and is turned off in response to the gate-off voltage. In the case of the n-channel transistor, the gate-on voltage can be a gate high voltage VGH, and the gate-off voltage can be a gate low voltage VGL. In case of the p-channel transistor, the gate-on voltage can be the gate low voltage VGL, and the gate-off voltage can be the gate high voltage VGH. Further, the term "clock" can be equivalent to and interchangeably used with the term "clock signal."

Hereinafter, various embodiments of the present disclosure will be described in detail with reference to the accompanying drawings. All the components of each display device according to all embodiments of the present disclosure are operatively coupled and configured.

Figure 2:
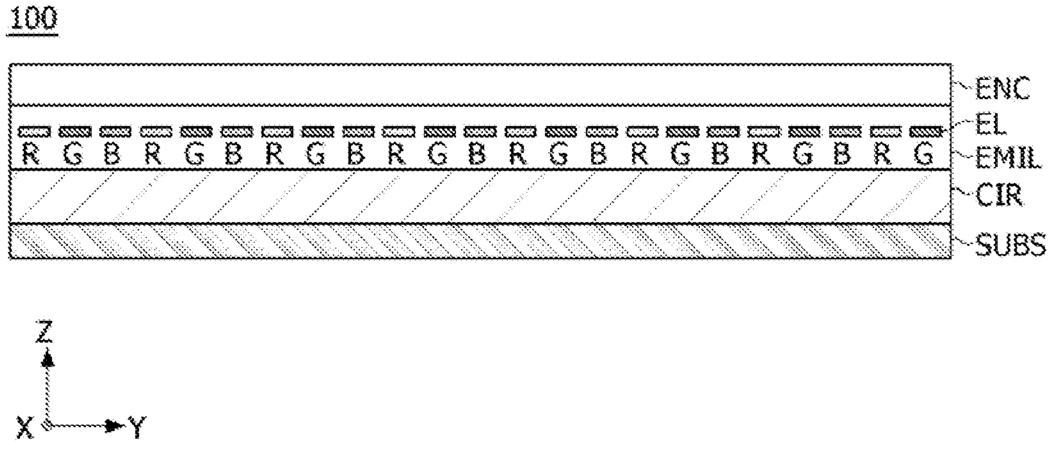
FIG. 2 is a cross-sectional view showing a cross-sectional structure of the display panel shown in FIG. 1.
Figure 3:
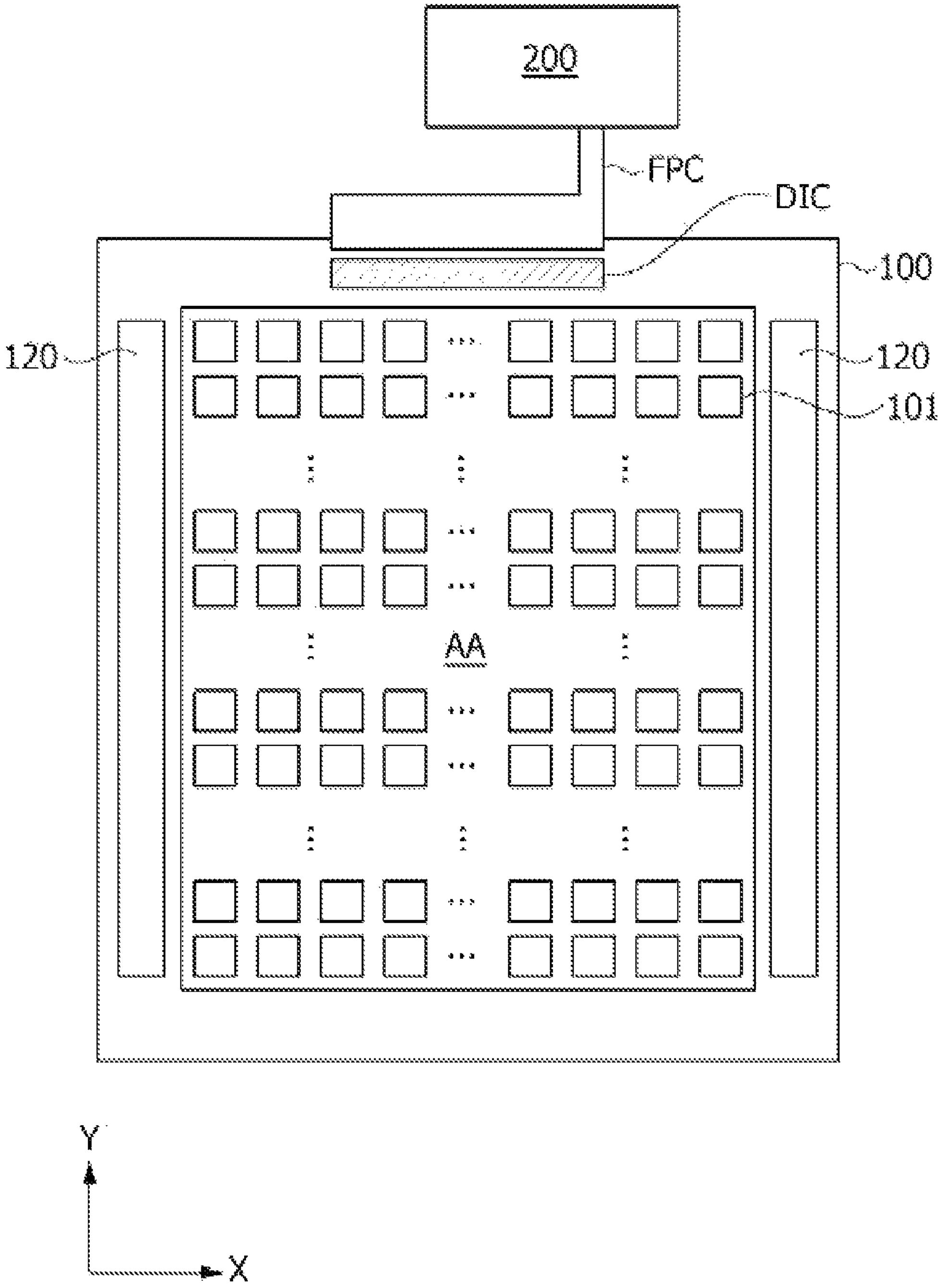
FIG. 3 is a diagram schematically showing a display device of a mobile terminal according to an example of the present disclosure.

FIG. 1 is a block diagram illustrating a display device according to one embodiment of the present disclosure. FIG. 2 is a cross-sectional view illustrating a cross-sectional structure of the display panel shown in FIG. 1. FIG. 3 is a diagram schematically illustrating a display device of a mobile terminal.

Referring to FIGS. 1 to 3, the display device according to an embodiment of the present disclosure includes a display panel 100, a display panel driving circuit for writing pixel data to pixels of the display panel 100, and a power supply 140 for generating power necessary for driving the pixels and the display panel driving circuit.

The display panel 100 can be a panel having a rectangular structure with a length in an X-axis direction, a width in a Y-axis direction, and a thickness in a Z-axis direction. A display area (active area) AA of the display panel 100 includes a pixel array (having a plurality of pixels) for displaying an input image thereon. A non-display area (non-active area) can be located outside the display area AA, and can surround the display area AA completely or in part only. In this example, a non-display area BZ can include a bezel area. The pixel array includes a plurality of data lines 102, a plurality of gate lines 103 intersecting the data lines 102, and pixels 101 arranged in a matrix form. The display panel 100 can further include power lines commonly connected to the pixels 101. The power lines are connected to constant voltage nodes of the pixel circuits and supply a constant voltage necessary for driving the pixels 101 to the pixels 101.

Each of the pixels 101 can be divided into a red sub-pixel, a green sub-pixel, and a blue sub-pixel for color implementation. Each of the pixels can further include a white sub-pixel, but other variations are possible. Each of the sub-pixels includes a pixel circuit for driving a light emitting element. Each of the pixel circuits is connected to the data lines, the gate lines, and the power lines.

The pixels can be disposed as real color pixels and pentile pixels. A pentile pixel can realize a higher resolution than the real color pixel by driving two sub-pixels having different colors as one pixel 101 through the use of a preset pixel rendering algorithm. Pixel rendering algorithms can compensate for insufficient color representation in each pixel with the color of light emitted from an adjacent pixel.

The pixel array includes a plurality of pixel lines L1 to Ln, where n is a real number such as a positive integer greater than 1. Each of the pixel lines L1 to Ln includes one line of pixels arranged along the line direction (X-axis direction) in the pixel array of the display panel 100. Sub-pixels arranged in one pixel line share the gate lines 103. Sub-pixels arranged in the column direction Y along a data line direction share the same data line 102. One horizontal period is a time obtained by dividing one frame period by the total number of the pixel lines L1 to Ln.

The display panel 100 can be implemented as a non-transmissive display panel or a transmissive display panel. The transmissive display panel can be applied to a transparent display device in which an image is displayed on a screen and an actual background is visible. The display panel 100 can be manufactured as a flexible display panel. The display panel can be implemented as a flexible display panel.

The cross-sectional structure of the display panel 100 can include a circuit layer CIR, a light-emitting element layer EMIL, and an encapsulation layer ENC stacked on a substrate SUBS, as shown in FIG. 2.

The circuit layer CIR can include a thin-film transistor (TFT) array including a pixel circuit connected to wirings such as a data line, a gate line, a power line, and the like, a de-multiplexer array 112, and a gate driver 120. The circuit layer CIR includes a plurality of metal layers insulated with insulating layers interposed therebetween, and a semiconductor material layer.

The light-emitting element layer EMIL can include a light-emitting element driven by the pixel circuit. The light-emitting element can include a light-emitting element of a red sub-pixel, a light-emitting element of a green sub-pixel, and a light-emitting element of a blue sub-pixel. The light-emitting element layer EMIL can further include a light-emitting element of white sub-pixel. The light-emitting element layer EMIL corresponding to each of the sub-pixels can have a structure in which a light-emitting element and a color filter are stacked. The light-emitting elements EL in the light-emitting element layer EMIL can be covered by multiple protective layers including an organic film and an inorganic film.

The encapsulation layer ENC covers the light-emitting element layer EMIL to seal the circuit layer CIR and the light-emitting element layer EMIL. The encapsulation layer ENC can also have a multi-insulating film structure in which an organic film and an inorganic film are alternately stacked. The inorganic film blocks permeation of moisture and oxygen. The organic film planarizes the surface of the inorganic film. When the organic layer and the inorganic layer are stacked in multiple layers, the movement path of moisture and oxygen becomes longer than that of a single layer, so that penetration of moisture and oxygen affecting the light-emitting element layer EMIL can be effectively blocked.

A touch sensor layer can be formed on the encapsulation layer ENC, and a polarizing plate or a color filter layer can be disposed thereon. The touch sensor layer can include capacitive touch sensors that sense a touch input based on a change in capacitance before and after the touch input. The touch sensor layer can have metal wiring patterns and insulating films that form the capacitance of the touch sensors. The insulating films can insulate an area where the metal wiring patterns intersect and can planarize the surface of the touch sensor layer. The polarizing plate can improve visibility and contrast ratio by converting the polarization of external light reflected by metal in the touch sensor layer and the circuit layer. The polarizing plate can be implemented as a circular polarizing plate or a polarizing plate in which a linear polarizing plate and a phase retardation film are bonded together. A cover glass can be adhered to the polarizing plate. The color filter layer can include red, green, and blue color filters. The color filter layer can further include a black matrix pattern. The color filter layer can replace the polarizing plate by absorbing a part of the wavelength of light reflected from the circuit layer and the touch sensor layer, and increase the color purity of an image reproduced in the pixel array.

The power supply 140 generates constant voltages (or DC voltages) needed for driving the pixel array and the display panel driving circuit of the display panel 100 by using a DC-DC (direct current-direct current) converter. The DC-DC converter can include a charge pump, a regulator, a buck converter, a boost converter, and the like. The power supply 140 can generate the constant voltages such as a gamma reference voltage VGMA, the gate high voltage VGL, the gate low voltage VGH, a pixel driving voltage ELVDD, a pixel base voltage ELVSS, an initialization voltage Vini, and the like by adjusting the level of a DC input voltage applied from a host system 200. The gamma reference voltage VGMA is supplied to a data drive 110. The dynamic range of the data voltage outputted from the data driver 110 is determined by the voltage range of the gamma reference voltage. The dynamic range of the data voltage is the range of voltages between the uppermost grayscale voltage and the lowermost grayscale voltage.

The gate high voltage VGH and the gate low voltage VGL are supplied to a level shifter 150 and the gate driver 120. The constant voltages such as the pixel driving voltage ELVDD, the pixel base voltage ELVSS, the reference voltage Vref, and the like are supplied to the pixels 101 via the power lines commonly connected to the pixels 101.

The pixel driving voltage ELVDD can be outputted from a main power source of the host system 200 and supplied to the display panel 100. In this case, the power supply 140 does not need to output the pixel driving voltage ELVDD.

The display panel driving circuit writes pixel data of an input image to the pixels of the display panel 100 under the control of the timing controller 130. The display panel driving circuit includes the data driver 110 and the gate driver 120. The display panel driving circuit can further include a de-multiplexer array 112 disposed between the data driver 110 and the data lines 102.

The de-multiplexer array 112 sequentially supplies data voltages outputted from channels of the data driver 110 to the data lines 102 using a plurality of de-multiplexers DEMUX. A de-multiplexer can include a multiple of switch elements disposed on the display panel 100. When the de-multiplexer is disposed between the output terminals of the data driver 110 and the data lines 102, the number of channels of the data driver 110 can be reduced. The de-multiplexer array 112 can be omitted.

The display panel driving circuit can further include a touch sensor driver for driving touch sensors. The touch sensor driver is omitted from FIG. 1. The data driver 110 and the touch sensor driver can be integrated into one drive IC (integrated circuit). In a mobile terminal or a wearable terminal, the timing controller 130, the power supply 140, the level shifter 150, the data driver 110, the touch sensor driver, and the like can be integrated into one drive IC (DIC) as shown in FIG. 3.

The data driver 110 receives the pixel data of the input image received as a digital signal from the timing controller 130 and outputs the data voltages. The data driver 110 outputs the data voltages by converting the pixel data of the input image into a gamma compensation voltage using a digital-to-analog converter (DAC). The gamma reference voltage VGMA is divided into the gamma compensation voltage for each grayscale by a voltage divider circuit in the data driver 110, which is supplied to the DAC. The DAC generates the data voltages as the gamma compensation voltages corresponding to the grayscale values of the pixel data. The data voltages outputted from the DAC can be output to the data line 102 through output buffers in respective channels of the data driver 110, or can be outputted to the data line 102 through the de-multiplexer array 112.

The gate driver 120 can be formed in a circuit layer CIR on the display panel 100 together with TFT arrays of the pixel array and wirings. The gate driver 120 can be disposed in a non-display area (e.g., BZ) outside the display area AA in the display panel 100, or at least thereof can be disposed in the display area AA.

Figure 24:
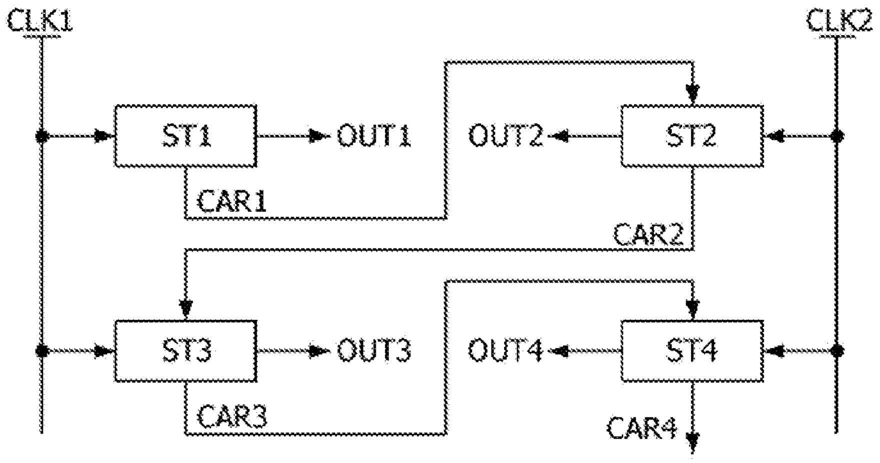
FIGS. 24 and 25 are diagrams showing a signal transmitter and a clock line connection structure of a gate driver in single-feeding of a gate signal according to an example of the present disclosure.
Figure 25:
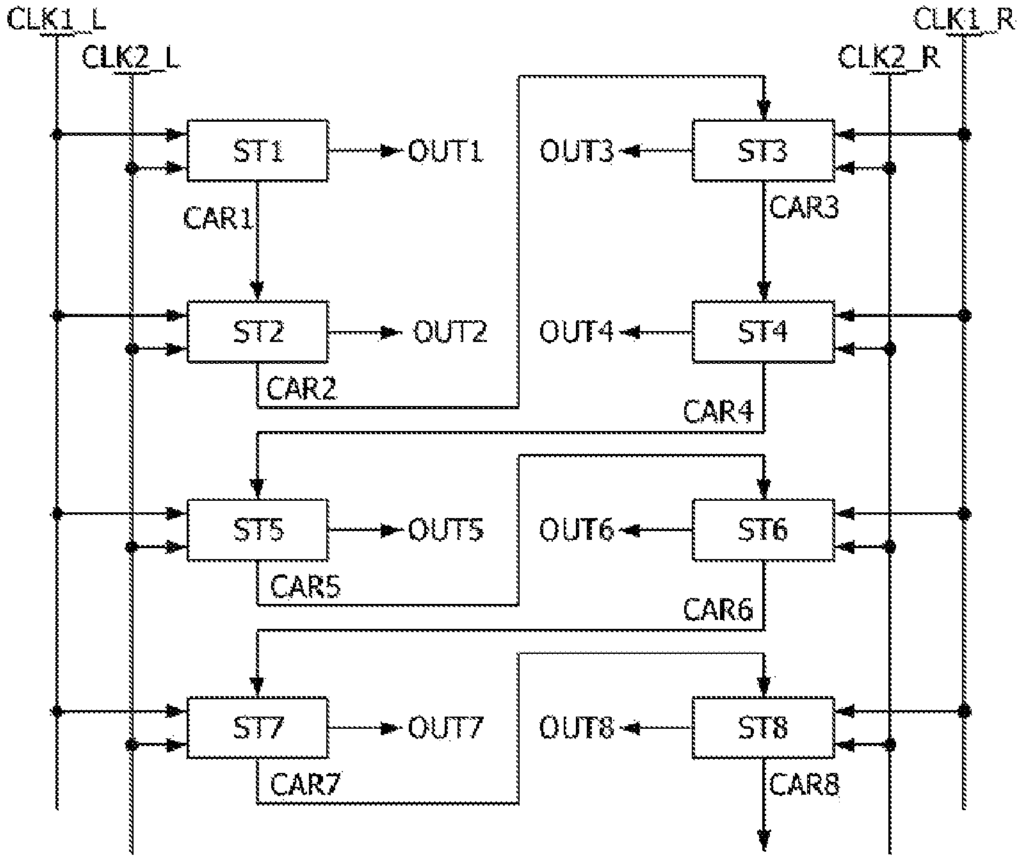

The gate driver 120 can include a plurality of shift registers for sequentially shifting pulses of the gate signals. The gate driver 120 can be disposed on either one side or both sides of the left non-display area BZ and the right non-display area BZ outside the display area AA in the display panel 100, as shown in FIGS. 24 and 25, to supply the gate signals to the gate lines 103 in a single feeding method. Here, in the single feeding method, the gate signals are applied to one ends of the gate lines. On the other hand, in a double feeding method, the gate signals are applied simultaneously to opposite ends of the gate lines 103.

The gate driver 120 sequentially outputs pulses of the gate signals to the gate lines 103 under the control of the timing controller 130. The gate driver 120 can sequentially supply the gate signals to the gate lines 103 by shifting the pulses of the gate signals using the shift registers.

The timing controller 130 receives from the host system 200 digital video data of the input image and timing signals synchronized with this data. The timing signal can include a vertical synchronization signal Vsync, a horizontal synchronization signal Hsync, and a data enable signal DE. Because a vertical period and a horizontal period can be known by counting the data enable signal DE, the vertical synchronization signal Vsync and the horizontal synchronization signal Hsync can be omitted. The data enable signal DE has a cycle of one horizontal period (1H).

The timing controller 130 generates a data timing control signal for controlling the operation timing of the data driver 110, a MUX control signal for controlling the operation timing of the de-multiplexer array 112, and a gate timing control signal for controlling the operation timing of the gate driver 120 based on the timing signals Vsync, Hsync, and DE received from the host system 200. The timing controller 130 synchronizes the data driver 110, the de-multiplexer array 112, the touch sensor driver, and the gate driver 120 by controlling the operation timing of the display panel driving circuit.

The gate timing control signal generated from the timing controller 130 can be inputted to the shift registers in the gate driver 120 through the level shifter 150. The level shifter 150 can receive the gate timing control signal and generate a start pulse and a shift clock to provide them to the gate driver 120 via clock lines CL1 to CLn. The level shifter 150 can supply the MUX control signal to the de-multiplexer array 112. An input signal to the level shifter 150 can be a digital voltage signal, and an output signal from the level shifter 150 can be an analog voltage signal that swings between the gate high voltage VGH and the gate low voltage VGL.

The host system 200 can include a main board of any of a television system, a set-top box, a navigation system, a personal computer (PC), an in-vehicle system, a mobile terminal, and a wearable terminal. The host system can scale an image signal from a video source to match the resolution of the display panel 100, and can transmit it to the timing controller 130 together with the timing signal.

In a mobile system, the host system 200 can be implemented by an application processor (AP). The host system 200 can transmit the pixel data of the input image to the drive IC (DIC) shown in FIG. 3 through a mobile Industry Processor Interface (MIPI). The host system 200 can be connected to the drive IC (DIC) through a flexible printed circuit, for example, a flexible printed circuit (FPC), as shown in FIG. 3. The drive IC can be attached on the display panel 100 in a COG (Chip on Glass) process.

The timing controller 130 can control the display panel driving circuit to divide and drive the display area AA for each area for a one-frame period.

Figure 4:
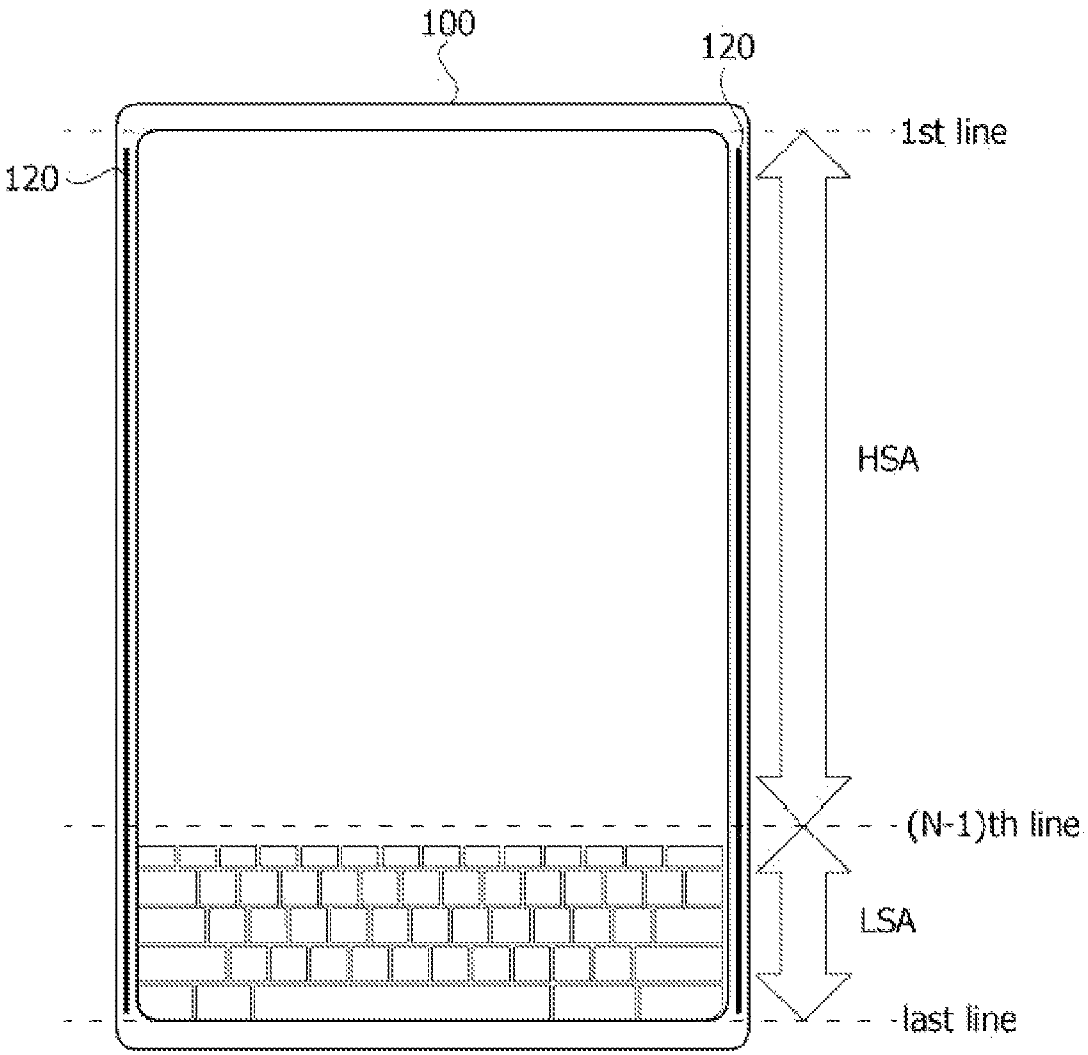
FIG. 4 is a diagram showing an example in which a display area is divided into a high-speed driving area and a low-speed driving area according to an example of the present disclosure.

As shown in FIG. 4, the display area AA can be divided into a high-speed driving area HSA in which pixels are driven at a high-speed and a low-speed driving area LSA in which pixels are driven at a low-speed. The positions and sizes of the high-speed driving area HSA and the low-speed driving area LSA are not fixed in the display area AA, and can be varied depending on the result of analysis of a contact or motion of the input image.

In the example of FIG. 4, a pixel area from a first pixel line '1st line', which is the uppermost end of the display area AA, to an (N−1)th pixel line '(N−1) th line' is the high-speed driving area HSA, and a pixel area from an N th pixel line 'N th line' to a last pixel line last line of the bottom thereof is the low-speed driving area LSA.

The high-speed driving area HSA is an area in which a frequency at which new pixel data is written to pixels, for example, a refresh rate is high because a scene transition is fast, such as video or game contents. The low-speed driving area LSA is an area with a low refresh rate in which new pixel data is written to pixels because the scene transition is slow, such as a still image or a soft keyboard screen. The soft keyboard screen can be displayed on at least some pixels within the pixel area AA, and a key input can be recognized as a touch input.

For example, the pixel data can be written to the pixels disposed in the high-speed driving area HSA at a frequency of 60 Hz or higher, for example, at a refresh rate of any one of 60 Hz, 120 Hz, 144 Hz, and 240 Hz. In contrast, the pixel data can be written to the pixels in the low-speed driving area LSA at a refresh rate of a frequency lower than 60 Hz. In this case, within an arbitrary one-frame period in which the low-speed driving area LSA is maintained at the previous image, the pixel data is written sequentially in units of pixel lines as the gate signal is shifted to the pixels in the high-speed driving area HSA, while the pixels in the low-speed driving area LSA maintain the previous image without new pixel data being written.

A timing controller 130 can modulate a clock inputted to a gate driver 120 at a scanning time point of the first pixel line in the low-speed driving area LSA while the pixels of the display area AA are sequentially scanned in units of pixel lines within one frame period. As a result of the clock modulation, some gate signals applied to the pixels in the low-speed driving area LSA are maintained at a specific voltage, such that pulses of some gate signals are not generated in the low-speed driving area, and the pixels can maintain light emission by maintaining the previously charged data voltage.

The timing controller 130 can reduce the power consumption of a data driver 110 by stopping driving of the data driver 110 in the low-speed driving area LSA. In addition, the timing controller 130 can control the signal transmitter of the gate driver 120 for driving the gate lines of the first line, for example, the Nth pixel line 'Nth line' in FIG. 4, from which the scanning of the low-speed driving area LSA is started in the same manner as in the embodiments below to reduce the power consumption of the gate driver 120.

Figure 5:
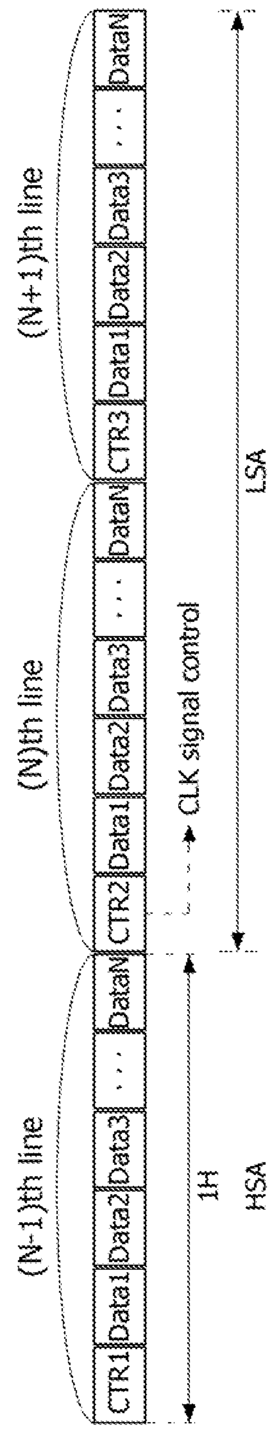
FIG. 5 is a diagram showing an example of a data packet format transmitted in a high-speed driving area and a low-speed driving area according to an example of the present disclosure.

FIG. 5 is a diagram showing an example of a data packet format transmitted in a high-speed driving area and a low-speed driving area.

Referring to FIG. 5, a host system 200 transmits one-line data 'Data1 to DataN' of an input image in one horizontal period 1H to the timing controller 130 or the drive IC DIC shown in FIG. 3. The one-line data Data1 to DataN include pixel data to be written to sub-pixels disposed on one-pixel line of the display area AA. The host system 200 can add and transmit control data packets CTR1, CTR2, and CTR3 before pixel data in every horizontal period. The control data packets CTR1, CTR2, and CTR3 can include an area identification code indicating whether the corresponding line data Data1 to DataN is data in the high-speed driving area HSA or data in the low-speed driving area LSA. For example, when the identification code is a first logical value, for example, "0 (zero or low)", the corresponding line data Data1 to DataN can be data in the high-speed driving area HSA, and when the identification code is a second logical value, for example, "1 (high)", the corresponding line data can be data in the low-speed driving area LSA.

The timing controller 130 reads the identification code of a control data packet to determine a data value of a gate timing control signal for controlling the gate driver 120 in a corresponding line. For example, the timing controller 130 regularly inverts the clock inputted to the shift register of the gate driver 120 during a scanning period of the high-speed driving area HSA, while the clock can be modulated such that the voltage of the clock is maintained at the previous voltage at the first pixel line from which scanning of the low-speed driving area LSA is started.

Each of the sub-pixels includes a pixel circuit including a driving element for driving a light emitting element and a capacitor connected to the driving element. The pixel circuit of each of the sub-pixels can include an internal compensation circuit to compensate for the data voltage by a threshold voltage of the driving element.

Figure 6:
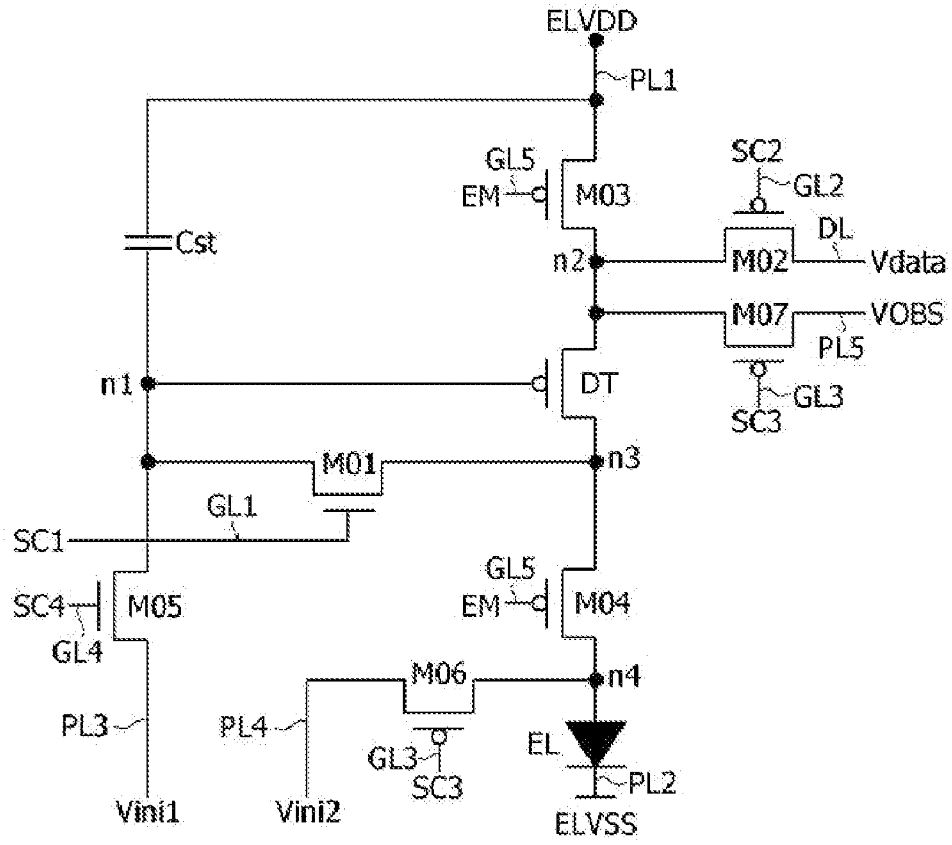
FIG. 6 is a circuit diagram showing a pixel circuit according to a first embodiment of the present disclosure.

FIG. 6 is a circuit diagram showing a pixel circuit according to a first embodiment of the present disclosure.

Referring to FIG. 6, the pixel circuit includes a light emitting element EL, a driving element DT for driving the light emitting element EL, a plurality of switch elements M01 to M07, and a capacitor Cst. The driving element DT and the first and fifth switch elements M01 and M05 can be implemented with an n-channel oxide TFT having a low off-current, respectively. The second, third, fourth, sixth, and seventh switch elements M02, M03, M04, M06, and M07 can be implemented with a p-channel LTPS TFT having a high on-current, respectively.

The pixel circuit is connected to a data line DL to which a data voltage Vdata of pixel data is applied, and gate lines GL1 to GL5 to which gate signals SC1 to SC4 and EM are applied.

The pixel circuit is connected to power nodes to which constant voltages are applied, such as a constant voltage node PL1 to which a pixel driving voltage ELVDD is applied, a constant voltage node PL2 to which a pixel base voltage ELVSS is applied, constant voltage nodes PL3 and PL4 to which initialization voltages Vini1 and Vini2 are applied, the constant voltage node PL5 to which an on-bias voltage VOBS is applied, and the like. The initialization voltages Vini1 and Vini2 can be, but are not limited to, divided into first and second initialization voltages Vini1 and Vini2. For example, the common initialization voltage Vini can be applied to the fifth and sixth switch elements M05 and M06 through one constant voltage node.

The power lines connected to the constant voltage nodes on the display panel can be commonly connected to all pixels.

Figure 7:
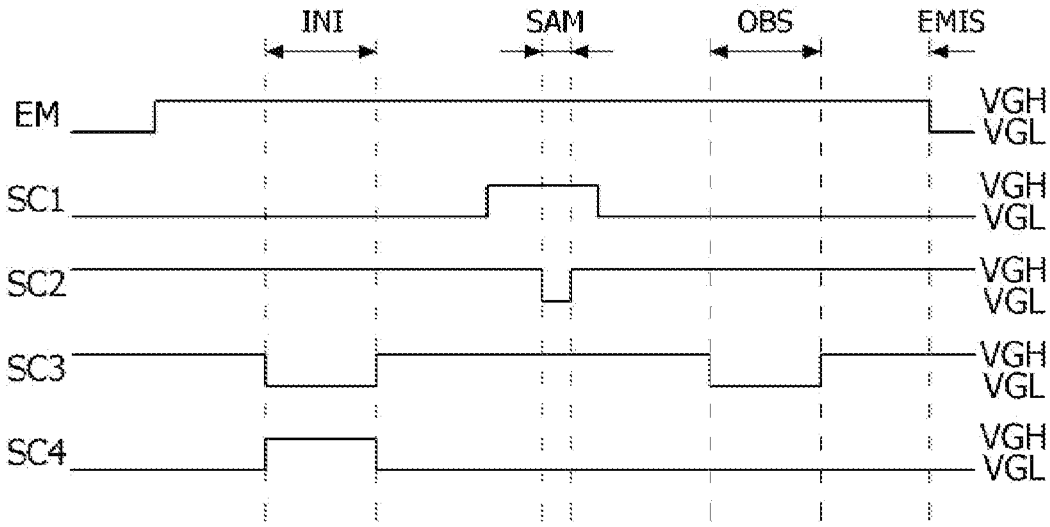
FIG. 7 is a waveform diagram showing gate signals applied to sub-pixels in which a data voltage of pixel data is charged in a capacitor of a pixel circuit according to an example of the present disclosure.
Figure 8:
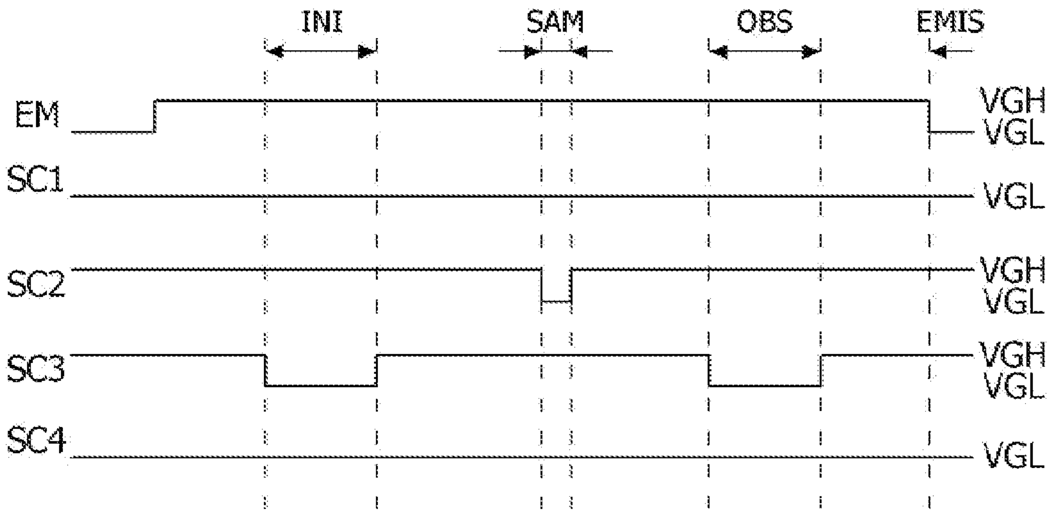
FIG. 8 is a waveform diagram showing gate signals applied to sub-pixels in which pixel data is not written and a capacitor of a pixel circuit is maintained at a previous voltage according to an example of the present disclosure.

The pixel driving voltage ELVDD is higher than the maximum voltage of the data voltage Vdata and is set to a voltage at which the driving element DT can be operated in a saturation area. The first and second initialization voltages Vini1 and Vini2 can be set to voltages lower than the pixel driving voltage ELVDD and higher than the pixel base voltage ELVSS. The first and second initialization voltages Vini1 and Vini2 can be set to the same or different voltages. The gate-high voltage VGH can be set to a voltage higher than the pixel driving voltage ELVDD, and the gate-low voltage VGL can be set to a voltage lower than the pixel base voltage ELVSS. The on-bias voltage VOBS is applied to the second node n2 during the first and third periods INI and OBS of every frame period in all sub-pixels, as shown in FIGS. 7 and 8. The on-bias voltage VOBS can be set to the same voltage as the pixel driving voltage ELVDD or the initialization voltages Vini1 and Vini2, or can be set to a separate constant voltage.

Figure 12:
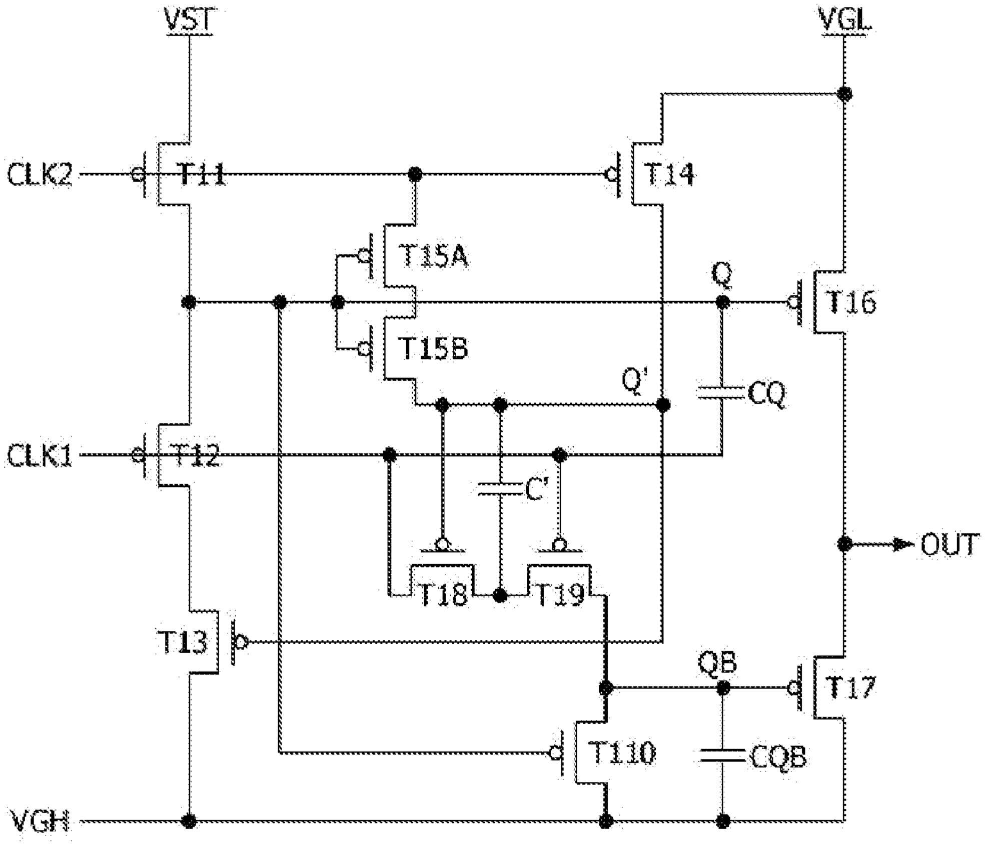
FIG. 12 is a circuit diagram showing in detail the gate driver according to the first embodiment of the present disclosure.
Figure 16:
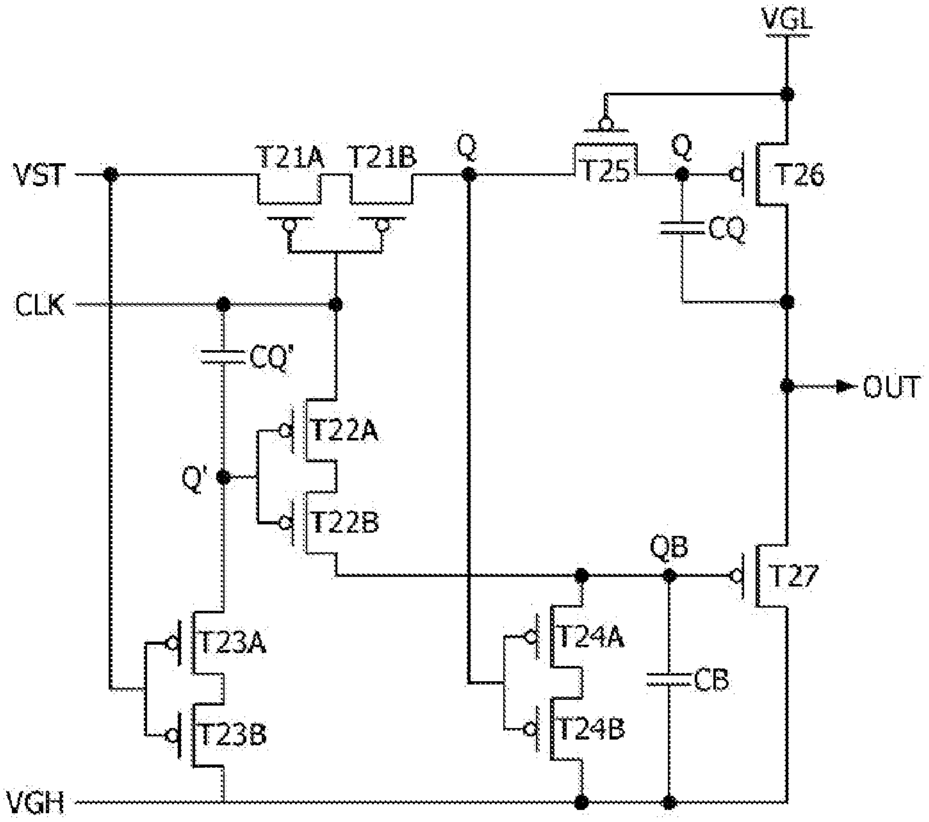
FIG. 16 is a circuit diagram showing in detail a gate driver according to the third embodiment of the present disclosure.

The gate signals SC1 to SC4 and EM include a pulse that swings between a gate-high voltage VGH and a gate-low voltage VGL. In the case of the pixel circuit shown in FIG. 6, the gate driver 120 can include a first shift register outputting a first gate signal SC1, a second shift register outputting a second gate signal SC2, a third shift register outputting a third gate signal SC3, a fourth shift register outputting a fourth gate signal SC4, and a fifth shift register outputting a fifth gate signal EM. Each of the first to fifth shift registers includes a VST node and a CLK node. Here, the VST node can be referred to as a signal node, and the CLK node can be referred to as a clock node. The first and fourth shift registers can be implemented with circuits as shown in FIGS. 12 and 16 and can be driven as shown in FIGS. 13, 14, 17 and 18.

The driving element DT generates a current depending on a gate-source voltage Vgs to drive the light emitting element EL. The driving element DT includes a gate electrode connected to a first node n1, a first electrode connected to a second node n2, and a second electrode connected to a third node n3.

The light emitting element EL can be implemented with an OLED. The light emitting element EL includes an anode electrode, a cathode electrode, and an organic compound layer interposed between the electrodes. The anode electrode of the light emitting element EL is connected to a fourth node n4, and the cathode electrode is connected to the second constant voltage node PL2 to which the pixel base voltage ELVSS is applied. The organic compound layer can include, but is not limited to, a hole injection layer (HIL), a hole transport layer (HTL), a light emission layer (EML), an electron transport layer (ETL), and an electron injection layer (EIL). When a voltage is applied to the anode and cathode electrodes of the light emitting element EL, holes passing through the hole transport layer (HTL) and electrons passing through the electron transport layer (ETL) are moved to the light emitting layer (EML) to form excitons. In this case, visible light is emitted from the light emitting layer (EML). The light emitting element EL can be implemented with an OLED having a tandem structure in which a plurality of light emitting layers are stacked. The OLEDs with a tandem structure can improve the luminance and lifetime of pixels.

The capacitor Cst is connected between the first constant voltage node PL1 to which the pixel driving voltage ELVDD is applied and the first node n1.

The first switch element M01 is connected between the first node n1 and the third node n3. The first switch element M01 is turned on in response to the gate-high voltage VGH of the first gate signal SC1 to connect the first node n1 to the third node n3. The first switch element M01 includes a gate electrode connected to the first gate line GL1 to which the first gate signal SC1 is applied, a first electrode connected to the first node n1, and a second electrode connected to the third node n3.

The second switch element M02 is connected between the data line DL and the second node n2. The second switch element M02 is turned on in response to the gate-low voltage VGL of the second gate signal SC2 to connect the data line DL to which the data voltage Vdata of pixel data is applied to the second node n2. The second switch element M02 includes a gate electrode connected to the second gate line GL2 to which the second gate signal SC2 is applied, a first electrode connected to the data line DL, and a second electrode connected to the second node n2.

The third switch element M03 is connected between the first constant voltage node PL1 to which the pixel driving voltage ELVDD is applied and the second node n2. The third switch element M03 is turned on in response to the gate-low voltage VGL of the fifth gate signal EM to connect the first constant voltage node PL1 to the second node n2. The third switch element M03 includes a gate electrode connected to the fifth gate line GL5 to which the fifth gate signal EM is applied, a first electrode connected to the first constant voltage node PL1, and a second electrode connected to the second node n2.

The fourth switch element M04 is connected between the third node n3 and the fourth node n4. The fourth switch element M04 is turned on in response to the gate-low voltage VGL of the fifth gate signal EM to connect the third node n3 to the fourth node n4. The fourth switch element M04 includes a gate electrode connected to the fifth gate line GL5, a first electrode connected to the third node n3, and a second electrode connected to the fourth node n4.

The fifth switch element M05 is connected between the first node n1 and the third constant voltage node PL3 to which the first initialization voltage Vini1 is applied. The fifth switch element M05 is turned on in response to the gate-high voltage VGH of the fourth gate signal SC4 to connect the first node n1 to the third constant voltage node PL3. The fifth switch element M05 includes a gate electrode connected to the fourth gate line GL4 to which the fourth gate signal SC4 is applied, a first electrode connected to the first node n1, and a second electrode connected to the third constant voltage node PL3.

The sixth switch element M06 is connected between the fourth node n4 and the fourth constant voltage node PL4 to which the second initialization voltage Vini2 is applied. The sixth switch element M06 is turned on in response to the gate-low voltage VGL of the third gate signal SC3 to connect the fourth node n4 to the fourth constant voltage node PL4. The sixth switch element M06 includes a gate electrode connected to the third gate line GL3 to which the third gate signal SC3 is applied, a first electrode connected to the fourth node n4, and a second electrode connected to the fourth constant voltage node PL4.

The initialization voltage can be set to a common initialization voltage without being separated into first and second initialization voltages Vini1 and Vini2. The second electrode of the fifth switch element M05 and the second electrode of the sixth switch element can be connected to the third constant voltage node PL3 to which a common initialization voltage is applied. In this case, the fourth constant voltage node PL4 and the power line connected thereto are not needed.

The seventh switch element M07 is connected between the second node n2 and a fifth constant voltage node PL5 to which the on-bias voltage VOBS is applied. The seventh switch element M07 is turned on in response to the gate-low voltage VGL of the third gate signal SC3 to connect the second node n2 to the fifth constant voltage node PL5 to which the on-bias voltage VOBS is applied. The seventh switch element M07 includes a gate electrode connected to the third gate line GL3 to which the third gate signal SC3 is applied, a first electrode connected to the second node n2, and a second electrode connected to a fifth constant voltage node PL5.

The pixel circuit shown in FIG. 6 can be a sub-pixel of the high-speed driving area HSA or a sub-pixel of the low-speed driving area LSA, in which the driving frequencies of the pixels in the display area AA are different from each other. When the pixel data is written to the pixel circuit shown in FIG. 6, the gate signals as shown in FIG. 7 can be applied to the pixel circuit. Meanwhile, when the pixel data is not written to the pixel circuit shown in FIG. 6 and driven by a previously charged data voltage Vdata, the gate signals shown in FIG. 8 can be applied to the pixel circuit. For example, within one frame period, the gate signals as shown in FIG. 7 can be applied to sub-pixels of pixel lines belonging to the high-speed driving area HSA, and the gate signals as shown in FIG. 8 can be applied to sub-pixels of pixel lines belonging to the low-speed driving area LSA.

Referring to FIGS. 6 and 7, a driving period of the pixel circuit includes a first period INI, a second period SAM, a third period OBS, and a fourth period EMIS.

During the first period INI, the main nodes n1 to n4 of the pixel circuit are initialized and the capacitor Cst is initialized. During the second period SAM, the compensated data voltage Vdata is stored in the capacitor Cst by a threshold voltage Vth of the driving element DT. During the third period OBS, the voltage of the second node n2 is reset to the on-bias voltage VOBS, and the voltage of the fourth node n4 is reset to the second initialization voltage Vini2. During the fourth period EMIS, the light emitting element EL is driven by a current generated depending on the gate-source voltage Vgs of the driving element DT.

During the first period INI, the voltages of the second, fourth, and fifth gate signals SC2, SC4, and EM are the gate-high voltage VGH, and the voltages of the first and third gate signals SC1 and SC3 are the gate-low voltage VGL. During the first period INI, the fifth, sixth and seventh switch elements M05, M06 and M07 are turned on, and the first, second, third and fourth switch elements M01, M02, M03, and M04 are in the off-state.

During the second period SAM, the voltages of the first, third, and fifth gate signals SC1, SC3, and EM are the gate-high voltage VGH, and the second and fourth gate signals SC2 and SC4 are the gate-low voltage VGL. During the second period SAM, the first and second switch elements M01 and M02 are turned on, and the third, fourth, fifth, sixth, and seventh switch elements M03, M04, M05, M06, and M07 are in the off-state.

During the third period OBS, the voltages of the second and fifth gate signals SC2 and EM are the gate-high voltage VGH, and the first, third and fourth gate signals SC1, SC3, and SC4 are the gate-low voltage VGL. During the third period OBS, the sixth and seventh switch elements M06 and M07 are turned on, and the first, second, third, fourth and fifth switch elements M01, M02, M03, M04, and M05 are in the off-state.

During the fourth period EMIS, the voltages of the second and third gate signals SC2 and SC3 are the gate-high voltage VGH, and the first, fourth and fifth gate signals SC1, SC4, and SC5 are the gate-low voltage VGL. During the fourth period EMIS, the third and fourth switch elements M03 and M04 are turned on, and the first, second, fifth, sixth and seventh switch elements M01, M02, M05, M06, and M07 are in the off-state.

Referring to FIGS. 6 and 8, the driving period of the pixel circuit includes a first period INI, a second period SAM, a third period OBS, and a fourth period EMIS.

During the first period INI, the voltages of the second and fourth nodes n2 and n4 are initialized, and the voltages of the first and third nodes n1 and n3 and the capacitor Cst maintain the previous voltage. During the second period SAM, the data voltage Vdata is not stored in the capacitor Cst. During the third period OBS, the voltage of the second node n2 is reset to the on-bias voltage VOBS, and the voltage of the fourth node n4 is reset to the second initialization voltage Vini2. During the fourth period EMIS, the light emitting element EL is driven by a current generated depending on the gate-source voltage Vgs of the driving element DT.

During the first period INI, the voltages of the second, fourth, and fifth gate signals SC2, SC4, and EM are the gate-high voltage VGH, and the first and third gate signals SC1 and SC3 is the gate-low voltage VGL. During the first period INI, the sixth and seventh switch elements M06, and M07 are turned on, and the first, second, third, fourth, and fifth switch elements M01, M02, M03, M04, and M05 are in the off-state. In this case, since the first and fifth switch elements M01 and M05 are in the off-state, the voltage of the capacitor Cst is not initialized and is maintained at the previous voltage.

During the second period SAM, the voltages of the third and fifth gate signals SC3 and EM are the gate-high voltage VGH, and the first, second and fourth gate signals SC1, SC2, and SC4 are the gate-low voltage VGL. During the second period SAM, the second switch element M02 is turned on, and the first, third, fourth, fifth, sixth, and seventh switch elements M01, M03, M04, M05, M06, and M07 are in the off-state. In this case, since the first and fifth switch elements M01 and M05 are in the off-state, the voltage of the capacitor Cst is maintained at the previous voltage.

During the third period OBS, the voltages of the second and fifth gate signals SC2 and EM are the gate-high voltage VGH, and the first, third and fourth gate signals SC1, SC3, and SC4 is the gate-low voltage VGL. During the third period OBS, the sixth and seventh switch elements M06 and M07 are turned on, and the first, second, third, fourth and fifth switch elements M01, M02, M03, M04, and M05 are in the off-state.

During the fourth period EMIS, the voltages of the second and third gate signals SC2 and SC3 are the gate-high voltage VGH, and the first, fourth and fifth gate signals SC1, SC4, and SC5 are the gate-low voltage VGL. During the fourth period EMIS, the third and fourth switch elements M03 and M04 are turned on, and the first, second, fifth, sixth and seventh switch elements M01, M02, M05, M06, and M07 are in the off-state.

In the high-speed driving area HSA, after the voltage of the fourth gate signal SC4 is generated as a gate-on voltage of the fifth switch element M05, for example, a pulse of the gate-high voltage VGH, the voltage of the first and second gate signals SC1 and SC2 is generated as a pulse of the gate-on voltage VGH and VGL of the first and second switch elements M01 and M02. Therefore, in the pixel circuit of the sub-pixels disposed in the high-speed driving area HSA, the fifth switch element M05 is turned on in the first period INI to initialize the capacitor Cst, and then the first and second switch elements M01 and M02 are turned on in the second period SAM, such that the data voltage Vdata compensated for by the threshold voltage of the driving element DT is stored in the capacitor Cst.

In contrast, in the low-speed driving area LSA, the first and fourth gate signals SC1 and SC4 maintain the gate-off voltage, for example, the gate-low voltage VGL. Accordingly, in the pixel circuit of the sub-pixels disposed in the low-speed driving area LSA, the capacitor Cst maintains the previous voltage, and the data voltage Vdata is not charged in the capacitor Cst.

The voltages of the first and fourth gate signals SC1 and SC4 applied to the sub-pixels of the low-speed driving area LSA are maintained at the gate-off voltage, for example, the gate-low voltage VGL, without a transition. As a result, in the gate driver while the low-speed driving area LSA is scanned, almost no power consumption is generated in the second and fourth shift registers. In the sub-pixels of the low-speed driving area LSA, since the emission of the light emitting element EL is suppressed during an initialization period and the second node n2 needs to be reset, pulses of some gate signals can be generated as shown in FIG. 8.

Figure 9:
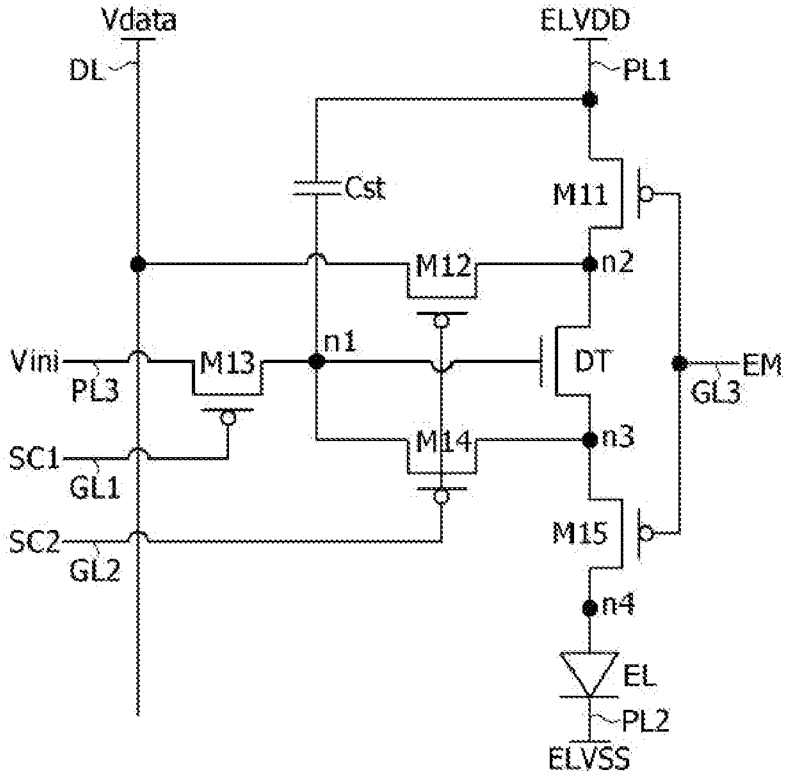
FIG. 9 is a circuit diagram showing a pixel circuit according to a second embodiment of the present disclosure.

FIG. 9 is a circuit diagram showing a pixel circuit according to a second embodiment of the present disclosure. In this embodiment, the components substantially the same as those of the above-described embodiment or the components to be repeatedly described will not be described in detail.

Referring to FIG. 9, the pixel circuit includes a light emitting element EL, a driving element DT for driving the light emitting element EL, a plurality of switch elements M11 to M15, and a capacitor Cst. Each of the driving element DT and the switch elements M11 to M15 can be implemented with p-channel LTPS TFTs.

The pixel circuit is connected to a data line DL to which a data voltage Vdata of pixel data is applied and gate lines GL1 to GL5 to which gate signals SC1, SC2, and EM are applied.

The pixel circuit is connected to power nodes to which a constant voltage is applied, such as a constant voltage node PL1 to which the pixel driving voltage ELVDD is applied, a constant voltage node PL2 to which the pixel base voltage ELVSS is applied, and a constant voltage node PL3 to which the initialization voltage Vini is applied. Power lines on the display panel to which the constant voltage nodes are connected can be commonly connected to all pixels.

The pixel driving voltage ELVDD is higher than the maximum voltage of the data voltage Vdata and is set to a voltage at which the driving element DT can be operated in a saturation area. The initialization voltage Vini can be set to a voltage lower than the pixel driving voltage ELVDD and higher than the pixel base voltage ELVSS.

Figure 20:
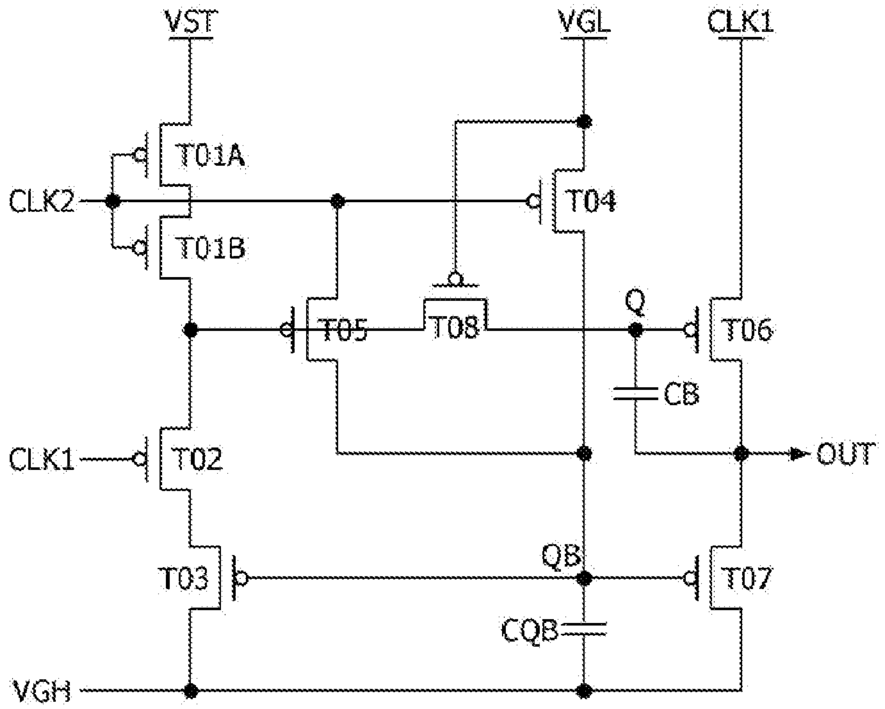
FIG. 20 is a circuit diagram showing in detail a gate driver according to a fourth embodiment of the present disclosure.
Figure 21:
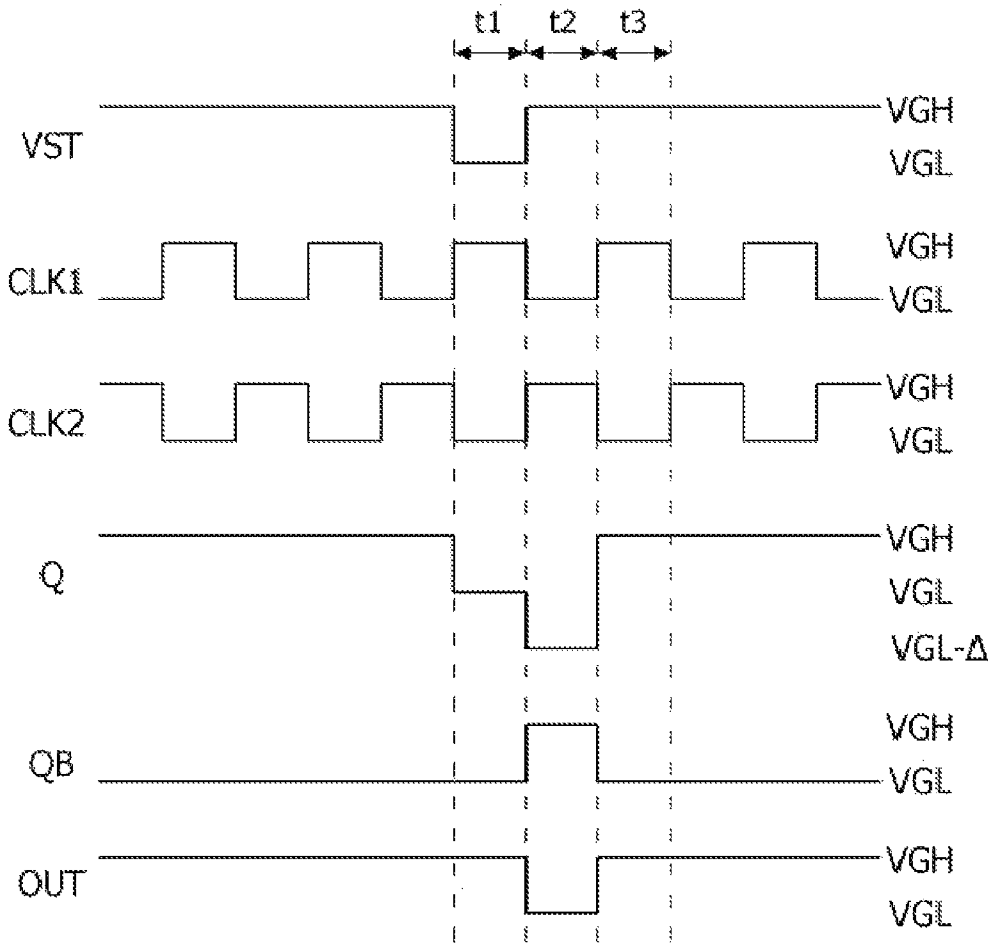
FIG. 21 is a waveform diagram showing an operation of the signal transmitter shown in FIG. 20 in a high-speed driving area.
Figure 22:
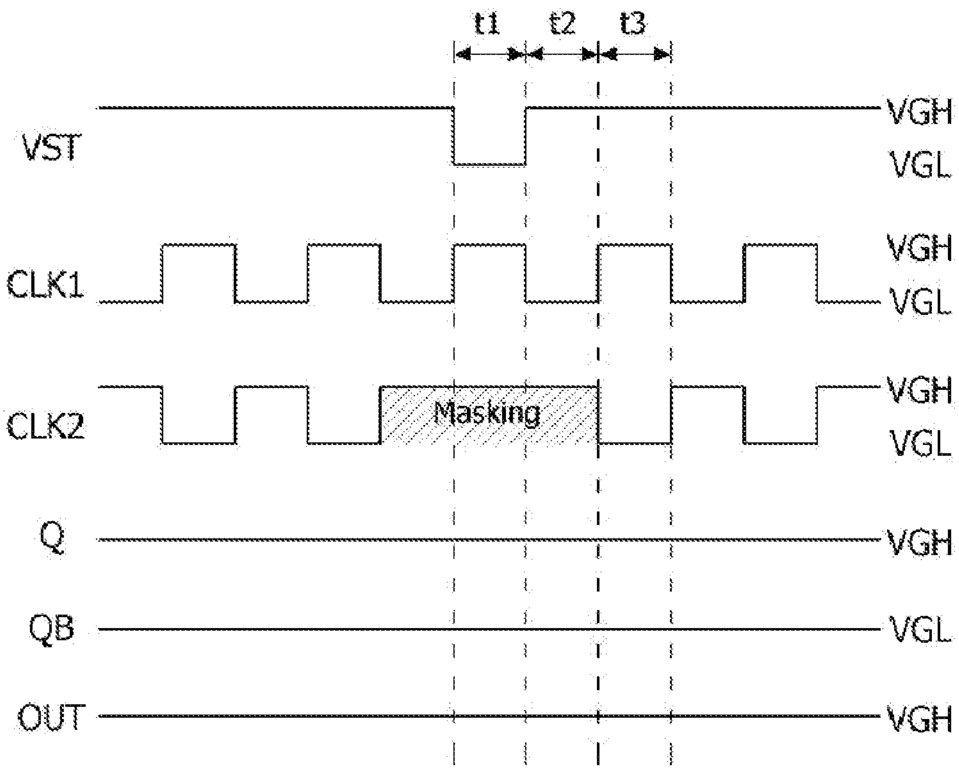
FIG. 22 is a waveform diagram showing an operation of the signal transmitter shown in FIG. 20 in a low-speed driving area.

The gate signals SC1, SC2, and EM include a pulse that swings between the gate-high voltage VGH and the gate-low voltage VGL. In the case of the pixel circuit shown in FIGS. 9 and 10, the gate driver 120 can include a first shift register outputting a first gate signal SC1, a second shift register outputting a second gate signal SC2, and a third shift register outputting the third gate signal EM. Each of the first to fifth shift registers includes a VST node and a CLK node. The first and second shift registers can be implemented with a circuit as shown in FIG. 20 and can be driven as shown in FIGS. 21 and 22.

The driving element DT drives the light emitting element EL by generating a current depending on a gate-source voltage Vgs. The driving element DT includes a gate electrode connected to the first node n1, a first electrode connected to the second node n2, and a second electrode connected to the third node n3. The anode electrode of the light emitting element EL is connected to the fourth node n4, and the cathode electrode is connected to the second constant voltage node PL2 to which the pixel base voltage ELVSS is applied. The capacitor Cst is connected between the first constant voltage node PL1 to which the pixel driving voltage ELVDD is applied and the first node n1.

The first switch element M11 is connected between the first constant voltage node PL1 and the second node n2. The first switch element M11 is turned on in response to the gate-low voltage of the third gate signal EM to connect the first constant voltage node PL1 to the second node n2. The first switch element M11 includes a gate electrode connected to the third gate line GL3 to which the third gate signal EM is applied, a first electrode connected to the first constant voltage node PL1, and a second electrode connected to the second node n2.

The second switch element M12 is connected between the data line DL and the second node n2. The second switch element M12 is turned on in response to the gate-low voltage of the second gate signal SC2 to connect the data line DL to which the data voltage Vdata of pixel data is applied to the second node n2. The second switch element M12 includes a gate electrode connected to the second gate line GL2 to which the second gate signal SC2 is applied, a first electrode connected to the data line DL, and a second electrode connected to the second node n2.

The third switch element M13 is connected between the first node n1 and the third constant voltage node PL3 to which the initialization voltage Vini is applied. The third switch element M13 is turned on in response to the gate-low voltage of the first gate signal SC1 to connect the first node n1 to the third constant voltage node PL3. The third switch element M13 includes a gate electrode connected to the first gate line GL1 to which the first gate signal SC1 is applied, a first electrode connected to the first node n1, and a second electrode connected to the third constant voltage node PL3.

The fourth switch element M14 is connected between the first node n1 and the third node n3. The fourth switch element M14 is turned on in response to the gate-low voltage of the second gate signal SC2 and connects the first node n1 to the third node n3. The fourth switch element M14 includes a gate electrode connected to the second gate line GL2, a first electrode connected to the first node n1, and a second electrode connected to the third node n3.

The fifth switch element M15 is connected between the third node n3 and the fourth node n4. The fifth switch element M15 is turned on in response to the gate-low voltage of the third gate signal EM to connect the third node n3 to the fourth node n4. The fifth switch element M15 includes a gate electrode connected to the third gate line GL3, a first electrode connected to the third node n3, and a second electrode connected to the fourth node n4.

Figure 10:
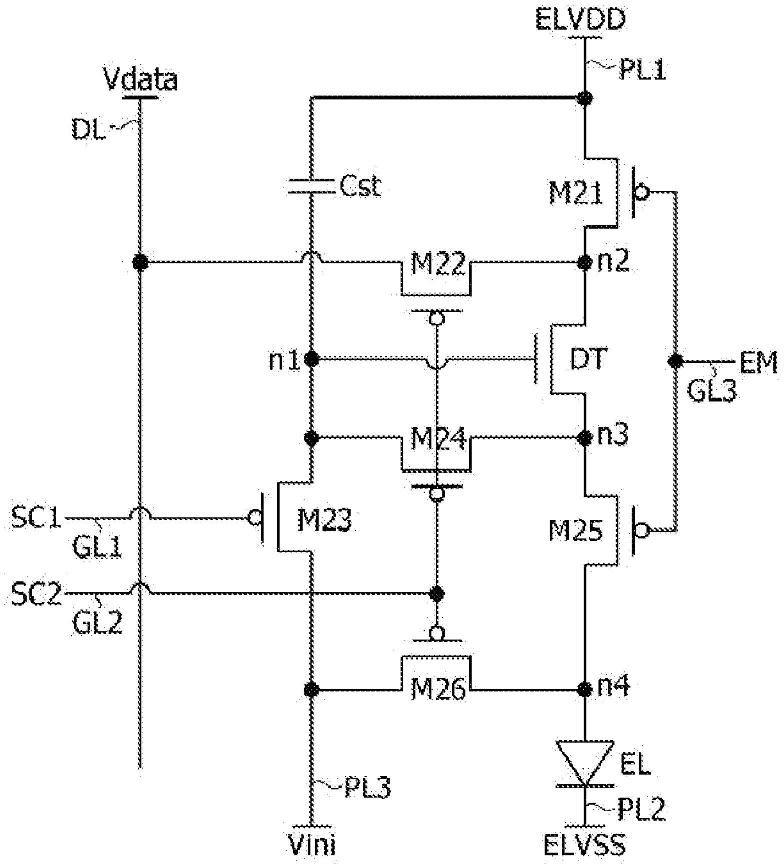
FIG. 10 is a circuit diagram showing a pixel circuit according to a third embodiment of the present disclosure.

FIG. 10 is a circuit diagram showing a pixel circuit according to a third embodiment of the present disclosure. In this embodiment, the components substantially the same as those of the above-described embodiment or the components to be repeatedly described will not be described in detail.

Referring to FIG. 10, the pixel circuit includes a light emitting element EL, a driving element DT for driving the light emitting element EL, a plurality of switch elements M21 to M26, and a capacitor Cst. Each of the driving element DT and the switch elements M21 to M26 can be implemented with p-channel LTPS TFTs.

The pixel circuit is connected to a data line DL to which a data voltage Vdata of pixel data is applied and gate lines GL1 to GL5 to which gate signals SC1, SC2, and EM are applied.

The driving element DT includes a gate electrode connected to the first node n1, a first electrode connected to the second node n2, and a second electrode connected to the third node n3. The anode electrode of the light emitting element EL is connected to the fourth node n4, and the cathode electrode is connected to the second constant voltage node PL2 to which the pixel base voltage ELVSS is applied. The capacitor Cst is connected between the first constant voltage node PL1 to which the pixel driving voltage ELVDD is applied and the first node n1.

The first switch element M21 is connected between the first constant voltage node PL1 and the second node n2. The first switch element M21 is turned on in response to the gate-low voltage of the third gate signal EM to connect the first constant voltage node PL1 to the second node n2. The first switch element M21 includes a gate electrode connected to the third gate line GL3 to which the third gate signal EM is applied, a first electrode connected to the first constant voltage node PL1, and a second electrode connected to the second node n2.

The second switch element M22 is connected between the data line DL and the second node n2. The second switch element M22 is turned on in response to the gate-low voltage of the second gate signal SC2 to connect the data line DL to which the data voltage Vdata of pixel data is applied to the second node n2. The second switch element M22 includes a gate electrode connected to the second gate line GL2 to which the second gate signal SC2 is applied, a first electrode connected to the data line DL, and a second electrode connected to the second node n2.

The third switch element M23 is connected between the first node n1 and the third constant voltage node PL3 to which the initialization voltage Vini is applied. The third switch element M23 is turned on in response to the gate-low voltage of the first gate signal SC1 to connect the first node n1 to the third constant voltage node PL3. The third switch element M23 includes a gate electrode connected to the first gate line GL1 to which the first gate signal SC1 is applied, a first electrode connected to the first node n1, and a second electrode connected to the third constant voltage node PL3.

The fourth switch element M24 is connected between the first node n1 and the third node n3. The fourth switch element M24 is turned on in response to the gate-low voltage of the second gate signal SC2 to connect the first node n1 to the third node n3. The fourth switch element M24 includes a gate electrode connected to the second gate line GL2, a first electrode connected to the first node n1, and a second electrode connected to the third node n3.

The fifth switch element M25 is connected between the third node n3 and the fourth node n4. The fifth switch element M25 is turned on in response to the gate-low voltage of the third gate signal EM to connect the third node n3 to the fourth node n4. The fifth switch element M25 includes a gate electrode connected to the third gate line GL3, a first electrode connected to the third node n3, and a second electrode connected to the fourth node n4.

The sixth switch element M26 is connected between the third constant voltage node PL3 and the fourth node n4. The sixth switch element M26 is turned on in response to the gate-low voltage of the second gate signal SC2 to connect the fourth node n4 to the third constant voltage node PL3. The sixth switch element M26 includes a gate electrode connected to the second gate line GL2, a first electrode connected to the third constant voltage node PL3, and a second electrode connected to the fourth node n4.

In the case of the pixel circuit shown in FIGS. 9 and 10, after the voltage of the first gate signal SC1 is generated as a pulse of the gate-low voltage VGL in the high-speed driving area HSA, the voltage of the first gate signal SC2 is generated as a pulse of the gate-low voltage VGL. Therefore, in the pixel circuit of the sub-pixels disposed in the high-speed driving area HSA, the third switch element M13 is turned on during the first period to initialize the capacitor Cst, and then the second and fourth switch elements M12 and M14 are turned on during the second period to store the data voltage Vdata compensated by the threshold voltage of the driving element DT in the capacitor.

In contrast, in the low-speed driving area LSA, the first and second gate signals SC1 and SC2 maintain the gate-off voltage, for example, the gate-high voltage VGH. Therefore, in the pixel circuit of the sub-pixels disposed in the low-speed driving area LSA, the first node n1 and the capacitor Cst maintain the previous voltage, and the data voltage Vdata is not charged in the capacitor Cst.

Figure 11:
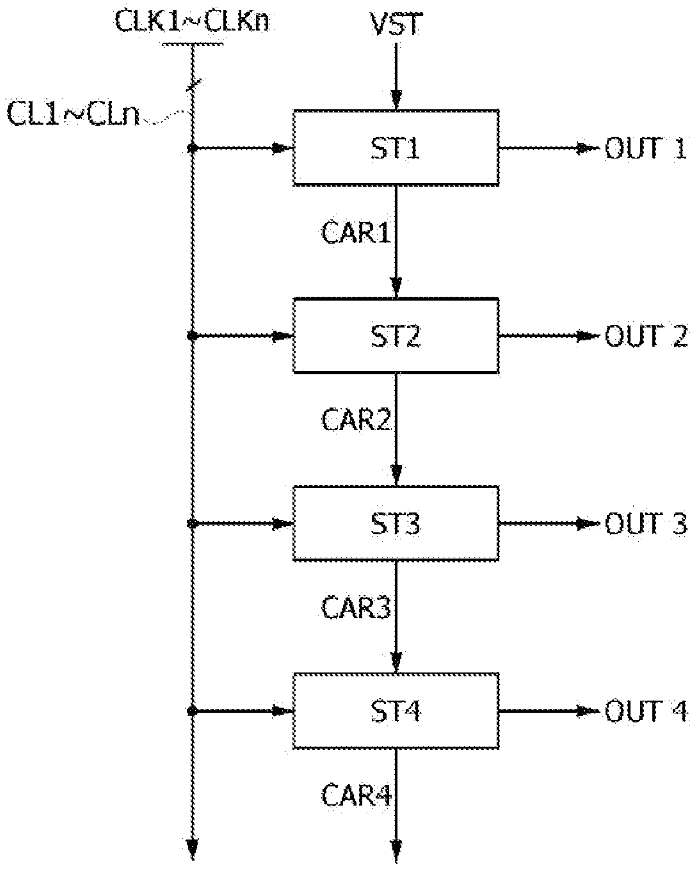
FIG. 11 is a circuit diagram schematically showing a shift register of a gate driver.

FIG. 11 is a schematic circuit diagram of a shift register of the gate driver 120.

Referring to FIG. 11, the shift register of the gate driver 120 includes signal transmitters ST1 to ST4 connected in cascade. The signal transmitters ST1 to ST4 receive a start pulse or a carry signal CAR, and receive clock signals CLK1 to CLKn through clock lines CL1 to CLn. The start pulse VST is the first clock signal CLK1 inputted to the first signal transmitter ST1. The carry signal CAR can be outputted from the previous signal transmitter and inputted to the VST node of the next signal transmitter.

Each of the signal transmitters ST1 to ST4 sequentially outputs gate signals OUT1 to OUT4 and simultaneously outputs carry signals CAR1 to CAR4. The first signal transmitter ST1 outputs the carry signal CAR1 through the first output node in response to the start pulse VST and the first shift clock CLK1 and simultaneously outputs a gate signal OUT1 through the second output node. Subsequently, the second signal transmitter ST2 outputs the carry signal CAR2 through the first output node in response to the carry signal CAR1 and the second shift clock CLK2 from the first signal transmitter ST1 and simultaneously outputs a gate signal OUT2 through the second output node. Subsequently, the third signal transmitter ST3 outputs the carry signal CAR3 through the first output node in response to the carry signal CAR2 and the third shift clock CLK3 from the second signal transmitter ST2, and simultaneously outputs a gate signal OUT3 through the second output node.

During the scanning period of the high-speed driving area HSA, each of the signal transmitters ST1 to ST4 sequentially outputs pulses of gate signals OUT1 to OUT4 and simultaneously transmits pulses of carry signals CAR1 to CAR4 to the VST node of the next signal transmitter. In contrast, from the first pixel line, for example, the Nth pixel line in FIG. 4, from which the low-speed driving area LSA is started, the signal transmitter outputs a gate signal maintaining a gate-off voltage without a pulse and does not transmit the pulses of the carry signals to the next signal transmitter. As a result, a pulse of a preset gate signal is not applied to the pixel circuit in the low-speed driving area LSA.

FIG. 12 is a circuit diagram showing in detail the gate driver according to the first embodiment of the present disclosure.

Referring to FIG. 12, each of the signal transmitters of the gate driver 120 includes first to tenth transistors T11 to T110.

The first transistor T11 connects a VST node (start pulse node) to a Q node in response to a gate-low voltage VGL of a second clock CLK2. A start pulse VST or a pulse of the carry signal from a previous signal transmitter is applied to the VST node. The first transistor T11 includes a gate electrode connected to the CLK2 node to which the second clock CLK2 is applied, a first electrode connected to the VST node, and a second electrode connected to the Q node.

The second transistor T12 is connected between the first transistor T11 and the third transistor T13. The second transistor T12 connects the Q node to the first electrode of the third transistor T13 in response to the gate-low voltage VGL of the first clock CLK1. The second transistor T12 includes a gate electrode connected to the CLK1 node to which the first clock CLK1 is applied, a first electrode connected to the Q node, and a second electrode connected to the first electrode of the third transistor T13. A capacitor CQ is connected between the CLK1 node and the Q node.

The third transistor T13 is connected between the second transistor T12 and a VGH node. A gate-high voltage VGH is applied to the VGH node. The third transistor T13 is turned on when the voltage of the Q' node is the gate-low voltage VGL to connect the second electrode of the second transistor T12 to the VGH node. The third transistor T13 includes a gate electrode connected to the Q' node, a first electrode connected to the second electrode of the second transistor T12, and a second electrode connected to the VGH node.

The fourth transistor T14 connects the VGL node to the Q' node in response to the gate-low voltage VGL of the second clock CLK2. The gate-low voltage VGL is applied to the VGL node. The fourth transistor T14 includes a gate electrode connected to the CLK2 node, a first electrode connected to the VGL node, and a second electrode connected to the Q' node.

The fifth transistors T15A and T15B are turned on when the voltage of the Q node is equal to or less than the gate-low voltage VGL to connect the CLK2 node to the Q' node. The fifth transistors T15A and T15B can include two transistors connected in series between the CLK2 node and the Q' node in order to reduce leakage current. A fifth-A transistor T15A includes a gate electrode connected to the Q node, a first electrode connected to the CLK2 node, and a second electrode. A fifth-B transistor T15B includes a gate electrode connected to the Q node, a first electrode connected to the second electrode of the fifth-A transistor T15A, and a second electrode connected to the Q' node.

The sixth transistor T16 is turned on when the voltage of the Q node is equal to or less than the gate-low voltage VGL to connect the VGL node to the output node. The sixth transistor T16 includes a gate electrode connected to the Q node, a first electrode connected to the VGL node, and a second electrode connected to the output node.

The seventh transistor T17 is turned on when the voltage of the QB node is equal to or less than the gate-low voltage VGL to connect the VGH node to the output node. The seventh transistor T17 includes a gate electrode connected to the QB node, a first electrode connected to the output node, and a second electrode connected to the VGH node. A capacitor CQB is connected between the QB node and the VGH node.

The eighth transistor T18 is turned on when the voltage of the Q' node is equal to or less than the gate-low voltage VGL to connect the CLK1 node to the first electrode of the ninth transistor T19. The eighth transistor T18 includes a gate electrode connected to the Q' node, a first electrode connected to the CLK1 node, and a second electrode connected to the first electrode of the ninth transistor T19. A capacitor C' is connected between a node between the second electrode of the eighth transistor T18 and the first electrode of the ninth transistor T19 and a node Q'.

The ninth transistor T19 is turned on when the voltage of the Q node is equal to or less than the gate-low voltage VGL to connect the node between the eighth transistor T18 and the capacitor C' to the QB node QB. The ninth transistor T19 includes a gate electrode connected to the Q node, a first electrode connected to a node between the second electrode of the eighth transistor 18 and the capacitor C', and a second electrode connected to the QB node.

The tenth transistor T110 is turned on when the voltage of the Q node is equal to or less than the gate-low voltage VGL to connect the QB node to the VGH node. The tenth transistor T110 includes a gate electrode connected to the Q node, a first electrode connected to the QB node, and a second electrode connected to the VGH node.

Figure 13:
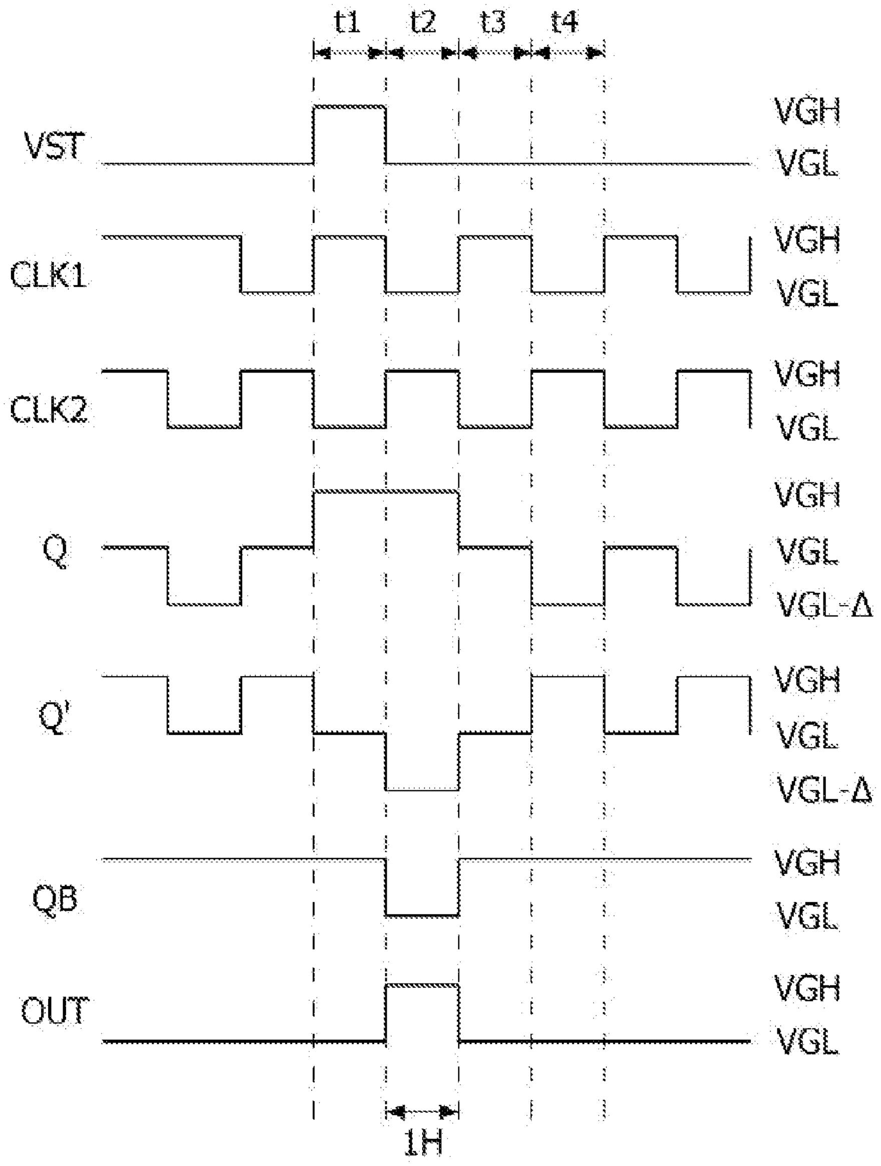
FIG. 13 is a waveform diagram showing an operation of the signal transmitter shown in FIG. 12 in a high-speed driving area.
Figure 14:
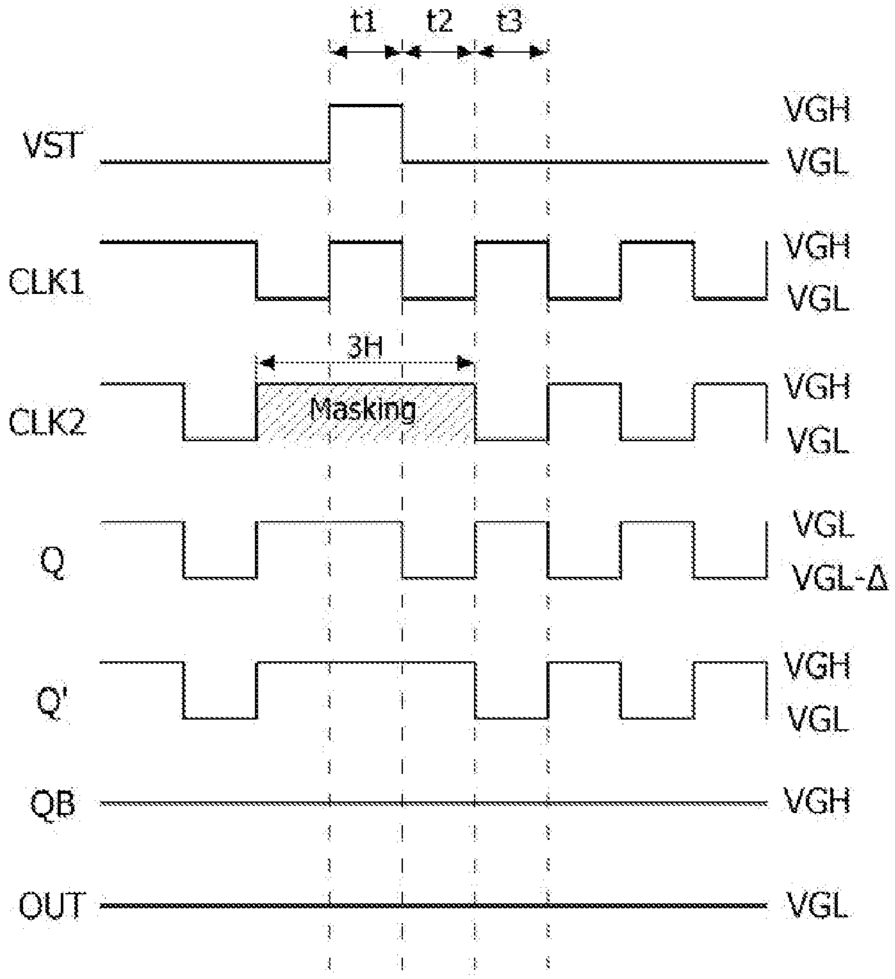
FIG. 14 is a waveform diagram showing an operation of the signal transmitter shown in FIG. 12 in a low-speed driving area.

The signal transmitter of the gate driver shown in FIG. 12 outputs a gate signal OUT including a pulse of the gate-high voltage VGH as shown in FIG. 13 when the gate line of the high-speed driving area HAS is driven. In contrast, the signal transmitter of the gate driver shown in FIG. 12 can output a gate signal OUT maintained at the gate-off voltage, for example, the gate-low voltage VGL, as shown in FIG. 14, when the gate line of the low-speed driving area LSA is driven. In the case of the pixel circuit shown in FIG. 6, an output node of the gate driver can be connected to the first gate line GL1 or the fourth gate line GL4.

FIG. 13 is a waveform diagram showing an operation of the signal transmitter shown in FIG. 12 in a high-speed driving area HSA. FIG. 14 is a waveform diagram showing an operation of the signal transmitter shown in FIG. 12 in a low-speed driving area LSA.

Referring to FIG. 13, one cycle of each of the first and second clocks CLK1 and CLK2 includes a high interval of the level of the gate-high voltage VGH (VGH interval) and a low interval of the level of the gate-low voltage VGL (VGL interval). The first and second clocks CLK1 and CLK2 are generated as clocks whose phases are inverted from each other during the scanning process of the high-speed driving area HSA.

The voltage of the CLK2 node is the gate-low voltage VGL in the interval t1. In this case, the first and fourth transistors T11 and T14 are turned on, such that the voltage of the Q node rises to the gate-high voltage VGH, the voltage of the Q' node falls to the gate-low voltage VGL, and the third and eighth transistors T13 and T18 are turned on.

The voltage of the CLK1 node is the gate-low voltage VGL in the interval t2. During the interval t2, since the second transistor T12 is turned on, the third transistor T13 is maintained in the on-state, and the Q node is connected to the VGH node, so that the voltage of the Q node is maintained at the gate-high voltage VGH. During the interval t2, the voltage of the Q' node is further lowered by VGL-A as due to bootstrapping of the Q' node with the CLK1 node through the capacitor C'. The voltage of the CLK1 node in the interval t2 is changed to the gate-low voltage VGL in the interval t2, so that the ninth transistor T19 is turned on, the QB node is connected to the CLK2 node through the eighth and ninth transistors T18 and T19, so that the voltage of the QB node is lowered to the gate-low voltage VGL. As a result, during the interval t2, the seventh transistor T17 is turned on, such that the voltage of the gate signal OUT is increased to the gate high voltage VGH.

The voltage of the CLK2 node is inverted back to the gate-low voltage VGL in the interval t3 and the first and fourth transistors T11 and T14 are turned on, so that the Q node is connected to the VST node and the voltage of the Q node is lowered to the gate-low voltage VGH, and the voltage of the Q' node is changed to the gate-low voltage VGL. During the interval t3, the sixth and tenth transistors T16 and T110 are turned on in response to the gate-low voltage VGL of the Q node, the voltage of the QB node rises to the gate-high voltage VGH, and the seventh transistor T17 is turned off. As a result, the gate signal OUT is changed to the gate-low voltage VGL in the interval t3.

The voltage of the CLK1 node is inverted to the gate-low voltage VGL in the interval t4. During the interval t2, the second and ninth transistors T12 and T19 are turned on, and the voltage of the Q node is lowered to VGL-A through the capacitor CQ, so that the fifth and tenth transistors T15A, T15B, and T110 is turned on. Therefore, the Q' node is connected to the CLK2 node, the voltage of the Q' node is charged up to the gate-high voltage VGH, and the QB node maintains the gate-high voltage VGH. As a result, the gate signals OUT maintain the gate-low voltage VGL in the interval t3.

In the N-th horizontal period in which the pixel line, for example, the Nth pixel line 'Nth line' in FIG. 4, from which the scanning of the low-speed driving area LSA is started, is scanned, the voltage of the second clock CLK2 is maintained at the previous voltage as shown in FIG. 14.

In FIG. 14, a 'Masking' portion of the CLK is a portion in which the VGH interval of the clock CLK is modulated longer at the scanning time point of the N-th line from which the low-speed driving area LSA is started.

Referring to FIG. 14, the first and second clocks CLK1 and CLK2 maintain the previous voltage VGH at the time of starting to scan the low-speed driving area LSA, which causes the VGH interval to be modulated longer than the high-speed driving area HSA, and then is generated as a clock with normal width. After the time point from which the scanning of the low-speed driving area LSA is started, phases of the first and second clocks CLK1 and CLK2 are inverted from each other in the same manner as in the scanning process of the high-speed driving area HSA.

The voltage of the second clock CLK2 is the same gate-high voltage VGH as the previous voltage in the interval t1 from which the low-speed driving area LSA is started. During the interval t1, the voltages of the VST node, the CLK1 node, and the CLK2 node are the gate-high voltage VGH, the voltage of the Q node is the gate-low voltage VGL, and the voltage of the Q' node is the gate-high voltage VGH. Therefore, during the interval t1, the sixth transistor T16 is maintained in the on-state, so that the voltage of the gate signal OUT is the gate-low voltage VGL. In this case, the voltage of the QB node is maintained at the gate-high voltage VGH.

The voltage of the CLK1 node is inverted to the gate-low voltage VGL in the interval t2. During the interval t2, the second and ninth transistors T12 and T19 are turned on, and the voltage of the Q node is lowered to VGL-A through the capacitor CQ, so that the fifth and tenth transistors T15A, T15B, and T110 is turned on. Therefore, the Q' node is connected to the CLK2 node so that the voltage of the Q' node is maintained at the gate-high voltage VGH, and the QB node is maintained at the gate-high voltage VGH. As a result, the gate signals OUT maintain the gate-low voltage VGL in the interval t2, so the carry signal pulse is not generated. Since the VST node voltage of the next signal transmitter is maintained at the gate-low voltage, the voltage of the gate signal outputted from the next signal transmitter is maintained at the gate-low voltage VGL.

The voltage of the CLK2 node is inverted to the gate-low voltage VGL in the interval t3. In this case, the first and fourth transistors T11 and T14 are turned on and the Q node is connected to the VST node so that the voltage of the Q node is changed to the gate-low voltage VGH and the voltage of the Q' node is changed to the gate-low voltage VGL. During the interval t3, the sixth and tenth transistors T16 and T110 are turned on in response to the gate-low voltage VGL of the Q node, and the voltage of the QB node is maintained at the gate-high voltage VGH. As a result, the voltage of the gate signal OUT is maintained at the gate-low voltage VGL in the interval t3, so that a pulse of the carry signal is not generated.

The voltages of the first and fourth gate signals SC1 and SC4 shown in FIG. 6 can be maintained at a gate-low voltage VGL, which is a gate-off voltage in the low-speed driving area LSA, by using the control method of the gate driver 120 as shown in FIG. 13. The voltage of the second clock CLK2 can be maintained at the gate-high voltage VGH during a third horizontal period from the N-th horizontal period from which the low-speed driving area LSA is started.

Figure 15:
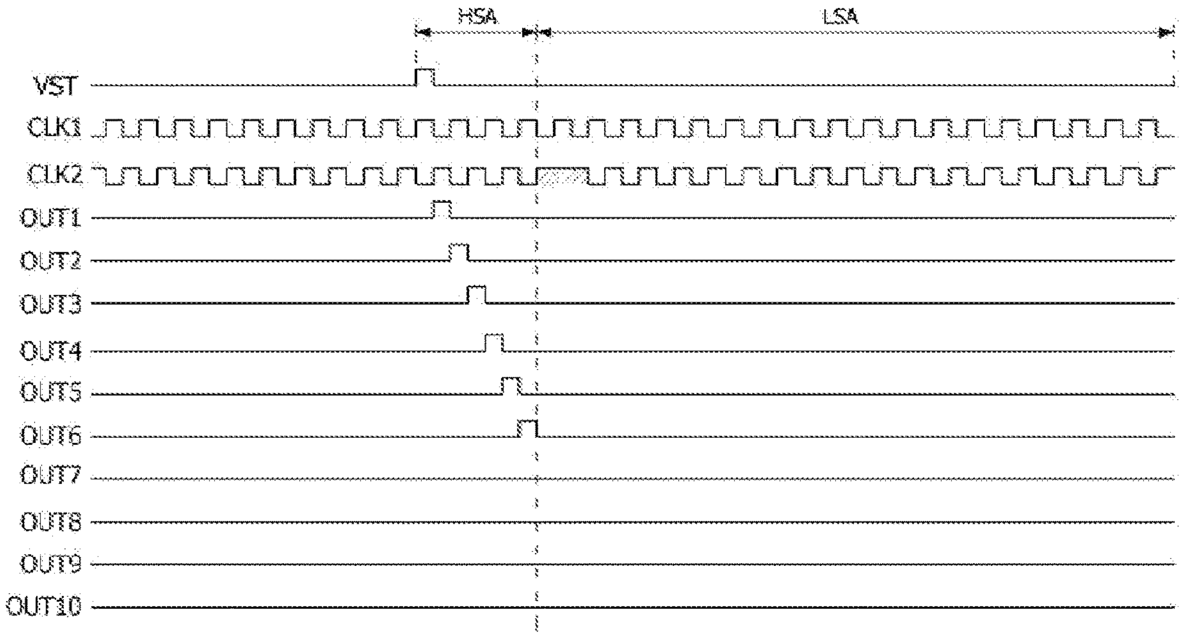
FIG. 15 is a simulation result of modulating a clock (clock signal) inputted to the circuit shown in FIG. 12.

FIG. 15 is a simulation result obtained by modulating the second clock CLK2 inputted to the circuit shown in FIG. 12.

As can be seen in FIG. 15, a pulse shift of the gate signal stops when the VGH interval of the second clock CLK2 is modulated for a long time, so that the voltages of the gate signals OUT7 to OUT10 are maintained at the gate low voltage VGL in the low-speed driving area LSA.

FIG. 16 is a circuit diagram showing in detail a gate driver according to a second embodiment of the present disclosure.

Referring to FIG. 16, each of the signal transmitters of the gate driver 120 includes first to eighth transistors T21A to T28.

The first transistors T21A and T21B connect a VST node to a Q node in response to a gate-low voltage VGL of a clock CLK. A start pulse VST or a pulse of a carry signal pulse from a previous signal transmitter is applied to the VST node. The first transistors T21A and T21B can include two transistors connected in series between the VST node and the Q node to reduce leakage current. The first-A transistor T21A includes a gate electrode connected to the CLK node to which the clock CLK is inputted, a first electrode connected to the VST node, and a second electrode. The first-B transistor T21B includes a gate electrode connected to the CLK node, a first electrode connected to the second electrode of the first-A transistor T21A, and a second electrode connected to the Q node.

The second transistors T22A and T22B are connected between the CLK node and the QB node. The second transistors T22A and T22B are turned on when the voltage of the Q' node is the gate-low voltage VGL to connect the CLK node to the QB node. The second transistors T22A and T22B can include two transistors connected in series between the CLK node and the QB node to reduce leakage current. The second-A transistor T22A includes a gate electrode connected to the Q' node, a first electrode connected to the CLK node, and a second electrode. The second-B transistor T22B includes a gate electrode connected to the Q' node, a first electrode connected to the second electrode of the second-A transistor T22A, and a second electrode connected to the QB node. A capacitor CQ' is connected to the CLK node and the Q' node.

The third transistors T23A and T23B are connected between the Q' node and the VGH node. The gate-high voltage VGH is applied to the VGH node. The third transistors T23A and T23B are turned on when the voltage of the VST node is the gate-low voltage VGL to connect the Q' node to the VGH node. The third transistors T23A and T23B can include two transistors connected in series between the Q' node and the VGH node to reduce leakage current. The third-A transistor T23A includes a gate electrode connected to the VST node, a first electrode connected to the Q' node, and a second electrode. The third-B transistor T23B includes a gate electrode connected to the VST node, a first electrode connected to the second electrode of the third-A transistor T23A, and a second electrode connected to the VGH node.

The fourth transistors T24A and T24B are connected between the QB node and the VGH node. The fourth transistors T24A and T24B are turned on when the voltage of the Q node is at the gate-low voltage VGL to connect the QB node to the VGH node. The fourth transistors T24A and T24B can include two transistors connected in series between the QB node and the VGH node to reduce leakage current. The fourth-A transistor T24A includes a gate electrode connected to the Q node, a first electrode connected to the QB node, and a second electrode. The fourth-B transistor T24B includes a gate electrode connected to the Q node, a first electrode connected to the second electrode of the fourth-A transistor T24A, and a second electrode connected to the VGH node.

The fifth transistor T25 includes a gate electrode connected to the VGL node, a first electrode connected to one side Q node connected to the first transistors T21A and T21B, and a second electrode connected to the other side Q node connected to the sixth transistor T27.

The sixth transistor T26 is turned on when the voltage of the Q node is the gate-low voltage VGL to connect the VGL node to the output node. The sixth transistor T26 includes a gate electrode connected to the Q node, a first electrode connected to the VGL node, and a second electrode connected to the output node. A capacitor CQ is connected between the Q node and the output node.

The seventh transistor T27 is turned on when the voltage of the QB node is the gate-low voltage VGL to connect the VGH node to the output node. The seventh transistor T27 includes a gate electrode connected to the QB node, a first electrode connected to the output node, and a second electrode connected to the VGH node. A capacitor CQB is connected between the QB node and the VGH node.

Figure 17:
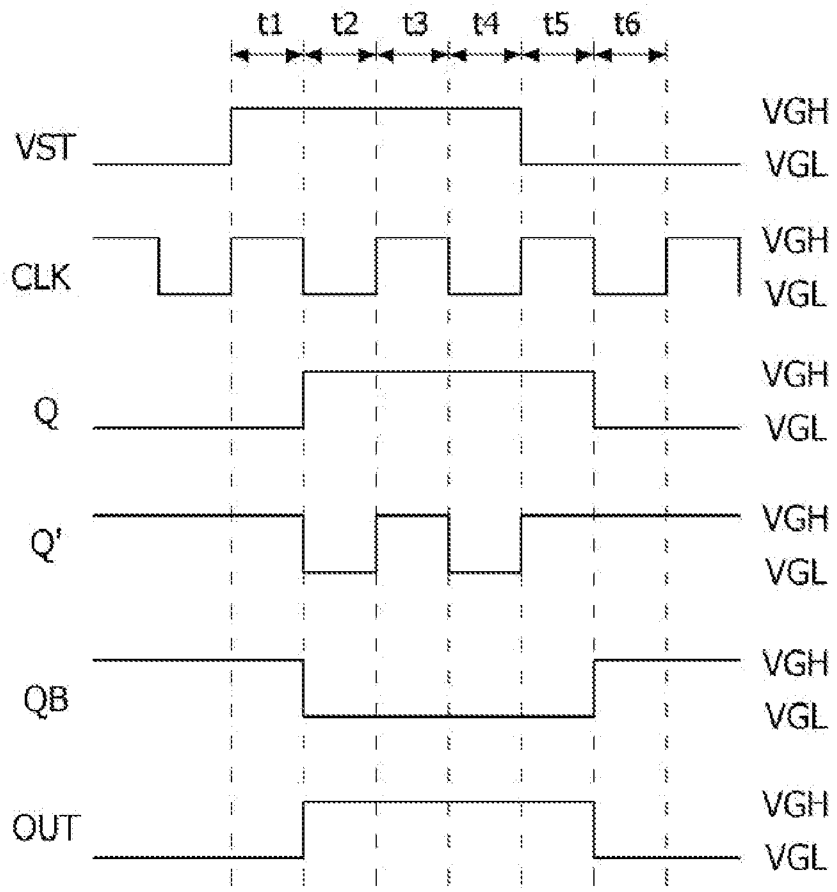
FIG. 17 is a waveform diagram showing an operation of the signal transmitter shown in FIG. 16 in a high-speed driving area.
Figure 18:
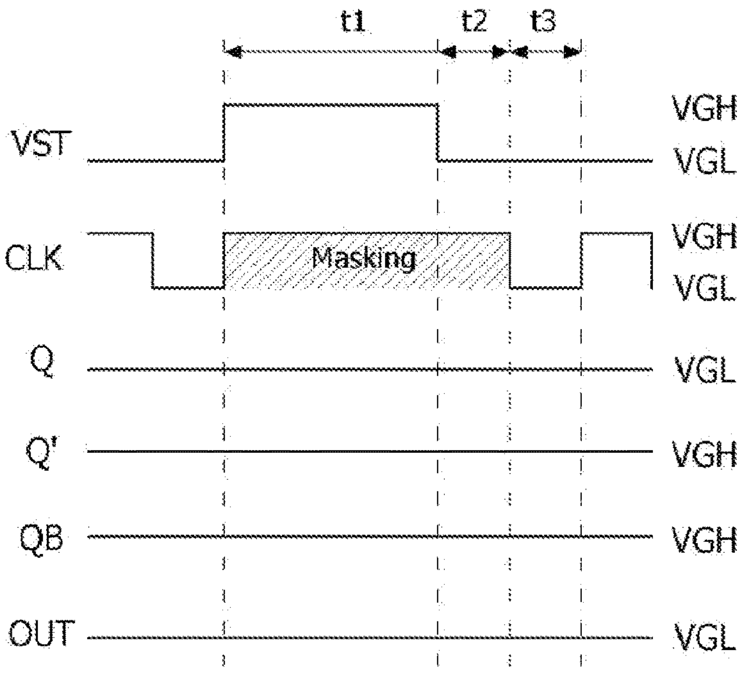
FIG. 18 is a waveform diagram showing an operation of the signal transmitter shown in FIG. 16 in a low-speed driving area.

The signal transmitter of the gate driver shown in FIG. 16 outputs a gate signal OUT including a pulse of the gate-high voltage VGH as shown in FIG. 17 when the gate line of the high-speed driving area HAS is driven. In contrast, the signal transmitters of the gate driver shown in FIG. 16 can output the gate signal OUT maintained at the gate-low voltage VGL as shown in FIG. 18 when the gate line of the low-speed driving area LSA is driven. In the case of the pixel circuit shown in FIG. 6, an output node of the gate driver can be connected to the first gate line GL1 or the fourth gate line GL4.

FIG. 17 is a waveform diagram showing an operation of the signal transmitter shown in FIG. 16 in a high-speed driving area HSA. FIG. 18 is a waveform diagram showing an operation of the signal transmitter shown in FIG. 16 in a low-speed driving area LSA.

Referring to FIG. 17, the voltages of the VST node and the CLK node are changed to the gate-high voltage VGH in the interval t1 to turn off the third transistors T23A and T23B, and the Q' node is floated to maintain the gate-high voltage VGH. In this case, the first transistors T21A and T21B are turned off and the Q node is maintained at the gate-low voltage VGL. During the interval t1, the voltage of the gate signal OUT is the gate-low voltage VGL.

The voltage of the CLK node is inverted to the gate low voltage VGL in the interval t2 to turn on the first transistors T21A and T21B, thereby charging the Q node with the voltage of the VST node, maintaining the voltage of the Q node at the gate high voltage VGH, and keeping the fourth transistors T24A and T24B and the sixth transistor T26 in the off state. During the interval t2, the voltage of the Q' node is lowered to the gate-low voltage VGL by bootstrapping through the capacitor CQ', which causes the second transistor T22A and T22B to turn on, lowering the voltage of the QB node to the gate low voltage VGL. As a result, the seventh transistor T27 is turned on during the interval t2 and the voltage of the gate signal OUT is increased to the gate-high voltage VGH.

The voltage of the CLK node is inverted to the gate-high voltage VGH in the interval t3, the first transistors T21A and T21B are turned off, and the Q node is floated, so that the fourth transistors T24A and T24B and the sixth transistors T26 are maintained in the off-state. When the voltage of the CLK node is increased to the gate-high voltage VGH in the interval t3, the voltage of the Q' node rises to the gate-high voltage VGH by bootstrapping through the capacitor CQ', turning off the second transistors T22A and T22B. During the interval t3, since the second transistors T22A and T22B are turned off, the QB node is floated, keeping the seventh transistor T27 in the on-state. Accordingly, the voltage of the gate signal OUT is maintained at the gate-high voltage VGH during the interval t3.

The voltage of the CLK node is inverted to the gate-low voltage VGL in the interval t4, the first transistors T21A and T21B are turned on, the Q node is charged with the voltage of the VST node, and the voltage of the Q node is maintained at the gate-high voltage VGH, so that the fourth transistors T24A and T24B and the sixth transistor T26 are maintained in the off-state. When the voltage of the CLK node is changed to the gate-low voltage VGL in the interval t4, the voltage of the Q' node is lowered to the gate-low voltage VGL by bootstrapping through the capacitor CQ', and the second transistors T22A and T22B are turned on to lower the voltage of the QB node to the gate-low voltage VGL. As a result, the seventh transistor T27 is turned on in the interval t4 so that the voltage of the gate signal OUT is maintained at the gate-high voltage VGH.

In the interval t5, the voltage of the VST node is inverted to the gate-low voltage VGL, and the voltage of the CLK node is inverted to the gate-high voltage VGH. The third transistors T23A and T23B are turned on in the interval t5, the voltage of the Q' node is increased to the gate-high voltage VGH, and the Q node and the QB node are floated, so that the previous voltage is maintained. Accordingly, the voltage of the gate signal OUT is maintained at the gate-high voltage VGH during the interval t5.

The voltage of the CLK node is inverted to the gate-low voltage VGL in the interval t6, the first transistors T21A and T21B are turned on, the Q node is connected to the VST node, so that the voltage of the Q node is lowered to the gate-low voltage VGL, and then the fourth transistors T24A and T24B and the sixth transistor T26 are turned on. Therefore, during the interval t6, the voltage of the gate signal OUT is lowered to the gate-low voltage VGL. During the interval t6, the third transistors T23A and T23B are turned on by the gate-low voltage VGL of the VST node, while the second transistors T22A and T22B are turned off. During the interval t6, since the fourth transistors T24A and T24B are turned on, the voltage of the QB node is increased to the gate-high voltage VGH, and the seventh transistor T27 is turned off.

In the N-th horizontal period in which the pixel line, for example, the Nth pixel line 'Nth line' in FIG. 4, from which the scanning of the low-speed driving area LSA is started, is scanned, the voltage of the clock CLK is maintained at the previous voltage as shown in FIG. 18. Therefore, when changing from the high-speed driving area HSA to the low-speed driving area LSA, an interval of the gate-high voltage of the clock CLK is longer than that in the high-speed driving area HSA, and a duty ratio is increased.

In FIG. 18, a "Masking" portion of a CLK is a portion in which the VGH interval of the clock CLK is modulated longer at the scanning time point of the N-th line from which the low-speed driving area LSA is started.

Referring to FIG. 18, in an interval t1 from which the low-speed driving area LSA is started, the voltage of the clock CLK is the same gate-high voltage VGH as the previous voltage. During the interval t1, the voltages of the VST node and the CLK node are gate-high voltage VGH. During the interval t1, the first transistors T21A and T21B are turned off and the Q node is floated to maintain the previous voltage VGL, and the third transistors T23A and T23B are turned off and the Q' node is floated to maintain the previous voltage VGH, so that a pulse of the carry signal is not generated. During the interval t1, the voltage of the gate signal OUT is the gate-low voltage VGL so that the fourth transistors T24A and T24B and the sixth transistor T26 are maintained in on-states by the gate-low voltage VGL of the Q node. During the interval t1, since the QB node is the gate-high voltage VGH, the seventh transistor T27 is maintained in the on-state.

In the interval t2, the voltage of the VST node is lowered to the gate-low voltage VGL and the third transistors T23A and T23B are turned on, so that the voltage of the Q' node is maintained at the gate-high voltage VGH. During the interval t2, the voltage of the CLK node is the gate-high voltage VGH, and the voltage of the Q node is the gate-low voltage VGL. Therefore, during the interval t2, the fourth transistors T24A and T24B and the sixth transistor T26 are maintained in on-states, so that the voltage of the gate signal OUT is the gate-low voltage VGL, and a pulse of the carry signal is not generated. During the interval t2, since the QB node is the gate-high voltage VGH, the seventh transistor T27 is maintained in the on-state.

The voltage of the CLK node is inverted to the gate-low voltage VGL in the interval t3. In this case, the first transistors T21A and T21B and the third transistors T23A and T23B are turned on and the Q node is connected to the VST node, so that the voltage of the Q node is maintained at the gate-low voltage VGL, and the voltage of the Q' node is maintained at the gate-high voltage VGH. As a result, the second transistors T22A and T22B are in the off-state during the interval t3. During the interval t3, since the voltage of the Q node is the gate-low voltage VGL, the fourth transistors T24A and T24B and the sixth transistor T26 are maintained in on-states, so that the voltage of the gate signal OUT is the gate-low voltage VGL, and a pulse of the carry signal is not generated. During the interval t3, since the QB node is the gate-high voltage VGH, the seventh transistor T27 is maintained in the on-state.

Figure 19:
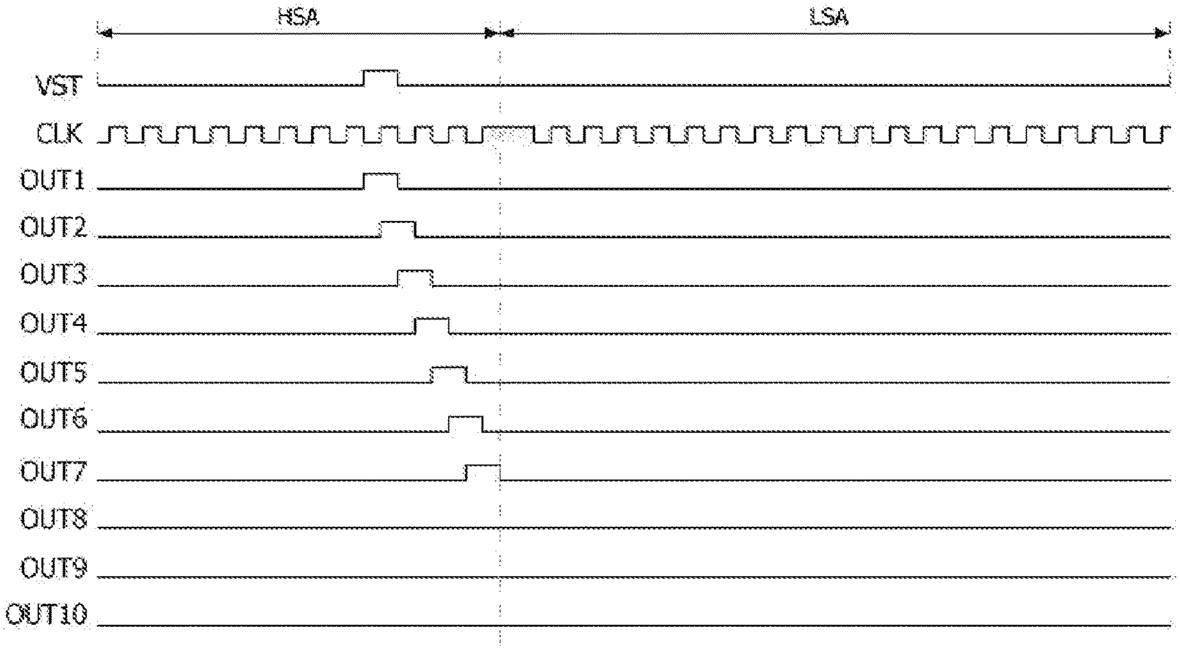
FIG. 19 is a simulation result of modulating a clock (clock signal) inputted to the circuit shown in FIG. 16.

FIG. 19 is a simulation result of modulating the clock CLK inputted to the circuit shown in FIG. 16.

As can be seen in FIG. 19, the pulse shift of the gate signal stops when the VGH interval of the clock CLK2 is modulated for a long time, so that the voltages of the gate signals OUT8 to OUT10 are maintained at the gate-low voltage VGL in the low-speed driving area LSA.

FIG. 20 is a circuit diagram showing in detail a gate driver according to a fourth embodiment of the present disclosure.

Referring to FIG. 20, each of the signal transmitters of the gate driver 120 includes first to eighth transistors T01A to T08.

The first transistors T01A and T01B are connected between a VST node and a Q node. The first transistors T01A and T01B connect the VST node to the Q node in response to the gate-low voltage VGL of the second clock CLK2. A start pulse VST or a pulse of a carry signal from a previous signal transmitter is applied to the VST node. The first transistors T01A and T01B can include two transistors connected in series between the VST node and the Q node to reduce leakage current. The first-A transistor T01A includes a gate electrode connected to the CLK2 node to which the second clock CLK2 is inputted, a first electrode connected to the VST node, and a second electrode. The first-B transistor T01B includes a gate electrode connected to the CLK2 node, a first electrode connected to the second electrode of the first-A transistor T01A, and a second electrode connected to the Q node.

The second transistor T02 is connected between the Q node and the third transistor T03. The second transistor T02 is turned on when the voltage of the first clock CLK1 is the gate-low voltage VGL to connect the Q node to the first electrode of the third transistor T03. The second transistor T02 includes a gate electrode connected to the CLK1 node to which the first clock CLK1 is inputted, a first electrode connected to the Q node, and a second electrode connected to the first electrode of the third transistor T03.

The third transistor T03 is connected between the second transistor T02 and the VGH node. The third transistor T03 is turned on when the voltage of the QB node is the gate-low voltage VGL to connect the second electrode of the second transistor T02 to the VGH node. The third transistor T03 includes a gate electrode connected to the QB node, a first electrode connected to the second electrode of the second transistor T02, and a second electrode connected to the VGH node.

The fourth transistor T04 is connected between the VGL node and the QB node. The fourth transistor T04 is turned on when the voltage of the CLK2 node is the gate-low voltage VGL to connect the VGL node to the QB node. The fourth transistor T04 includes a gate electrode connected to the CLK2 node, a first electrode connected to the VGL node, and a second electrode connected to the QB node.

The fifth transistor T05 is connected between the CLK2 node and the QB node. The fifth transistor T05 is turned on when the voltage of the Q node is the gate-low voltage VGL to connect the CLK2 node to the QB node. The fifth transistor T05 includes a gate electrode connected to the Q node, a first electrode connected to the CLK2 node, and a second electrode connected to the QB node.

The sixth transistor T06 is turned on when the voltage of the Q node is equal to or less than the gate-low voltage VGL to connect the CLK1 node to the output node. The sixth transistor T06 includes a gate electrode connected to the Q node, a first electrode connected to the CLK1 node, and a second electrode connected to the output node. A capacitor CB is connected between the Q node and the output node.

The seventh transistor T07 is turned on when the voltage of the QB node is the gate-low voltage VGL to connect the VGH node to the output node. The seventh transistor T07 includes a gate electrode connected to the QB node, a first electrode connected to the output node, and a second electrode connected to the VGH node. A capacitor CQB is connected between the QB node and the VGH node.

The eighth transistor T08 includes a gate electrode connected to the VGL node, a first electrode connected to one side Q node connected to the first and second transistors T01A, T01B and T02, and a second electrode connected to the other side Q node connected to the sixth transistor T06.

The signal transmitter of the gate driver shown in FIG. 20 outputs a gate signal OUT including a pulse of the gate-high voltage VGH as shown in FIG. 21 when the gate line of the high-speed driving area HSA is driven. In contrast, the signal transmitters of the gate driver shown in FIG. 20 can output the gate signal OUT maintained at the gate-low voltage VGH as shown in FIG. 22 when the gate line of the low-speed driving area LSA is driven. In the case of the pixel circuit shown in FIGS. 9 and 10, the output node of the gate driver can be connected to the first gate line GL1 or the second gate line GL2.

FIG. 21 is a waveform diagram showing an operation of the signal transmitter shown in FIG. 20 in a high-speed driving area HSA. FIG. 22 is a waveform diagram showing an operation of the signal transmitter shown in FIG. 20 in a low-speed driving area LSA.

Referring to FIG. 21, the voltages of the VST node and the CLK2 node are inverted to the gate-low voltage VGL in the interval t1, so that the first, fourth, and fifth transistors T01, T04, and T05 are turned on, and the voltages of the Q node and the QB node are lowered to the gate-low voltage VGL. Accordingly, the third, sixth, and seventh transistors T03, T06, and T07 are turned on in the interval t1, so that the voltage of the gate signal OUT is the gate-high voltage VGH. In the interval t1, the capacitor CB is charged with the gate-high voltage VGH.

The voltage of the CLK2 node is inverted to the gate-high voltage VGH in the interval t2, and the first and fourth transistors T01 and T04 are turned off, and the Q node is floated, such that the fifth and sixth transistors T05 and T06 are maintained in on-states. In the interval t2, since the voltage of the CLK2 node is the gate-high voltage VGH and the fifth transistor T05 is in the on-state, the voltage of the QB node is increased to the gate-high voltage VGH, such that the third and seventh transistors T03 and T07 are turned off. During the interval t2, the voltage of the CLK1 node is the gate-low voltage. Therefore, the voltage of the gate signal OUT is lowered to the gate-low voltage VGL, and the voltage of the Q node is further lowered to VGL-Δ by being bootstrapped through the capacitor CB, such that the eighth transistor T08 is turned on. In this case, the leakage current of the second transistor T02 is reduced because the voltage of the Q node on one side of the upper side of the second transistor T02 is maintained at VGL-Vth. Here, Vth is a threshold voltage of the eighth transistor T08.

The voltage of the CLK2 node is inverted to the gate-low voltage VGL in the interval t3 so that the first and fourth transistors T01 and T04 are turned on, and the voltage of the Q node is increased to the gate-high voltage VGH, while the voltage of the QB node is lowered to the gate-low voltage VGL. Accordingly, in the interval t3, the third and seventh transistors T03 and T07 are turned on, so that the voltage of the gate signal OUT is increased to the gate-high voltage VGH.

In the N-th horizontal period in which the pixel line, for example, the Nth pixel line 'Nth line' in FIG. 4, from which the scanning of the low-speed driving area LSA is started, is scanned, the voltage of the second clock CLK2 is maintained at the previous voltage as shown in FIG. 22. Therefore, when changing from the high-speed driving area HSA to the low-speed driving area LSA, an interval of the gate-high voltage of the clock CLK2 is longer than that in the high-speed driving area HSA, and a duty ratio is increased.

Referring to FIG. 22, the voltage of the VST node is the gate-low voltage VGL and the CLK2 node is the gate-high voltage VGH in the interval t1 from which the low-speed driving area LSA is started. The voltage of the CLK1 node in the interval t1 is the same gate-high voltage VGH of the CLK2 node. The first and fourth transistors T01 and T04 in the interval t1 are turned off, so that the voltage of the Q node is the gate-high voltage VGH. In the interval t1, since the voltage of the Q node is the gate-high voltage VGH, the sixth transistor T06 is turned off and the floated QB node is the gate-low voltage VGL, so that the seventh transistor T07 is turned off. Accordingly, the voltage of the gate signal OUT is maintained at the gate-high voltage VGH during the interval t1.

In the interval t2, the voltages of the VST node and the CLK2 node are maintained at the gate-high voltage VGH, and the voltage of the CLK1 node is inverted to the gate-low voltage VGL. In the interval t2, the first and fourth transistors T01 and T04 are turned off, the voltage of the Q node is maintained at the gate-high voltage VGH, and the voltage of the floated QB node is maintained at the gate-low voltage VGL. Therefore, during the interval t2, the sixth transistor T06 is maintained in an off-state and the seventh transistor T07 is maintained in the on-state, so that the voltage of the gate signal OUT is the gate-high voltage VGH.

In the interval t3, the voltage of the CLK2 node is inverted to the gate-low voltage VGL, and the voltages of the VST node and the CLK1 node are the gate-high voltage VGH. In the interval t3, the voltage of the CLK2 node is lowered to the gate-low voltage VGL and the first and fourth transistors T01 and T04 are turned on so that the voltage of the Q node is maintained at the gate-high voltage VGH and the QB node is connected to the VGL node through the fourth transistor T04 so that the voltage of the QB node is maintained at the gate-low voltage VGL. Therefore, during the interval t3, the sixth transistor T06 is maintained in an off-state and the seventh transistor T07 is maintained in the on-state, so that the voltage of the gate signal OUT is the gate-high voltage VGH.

Figure 23:
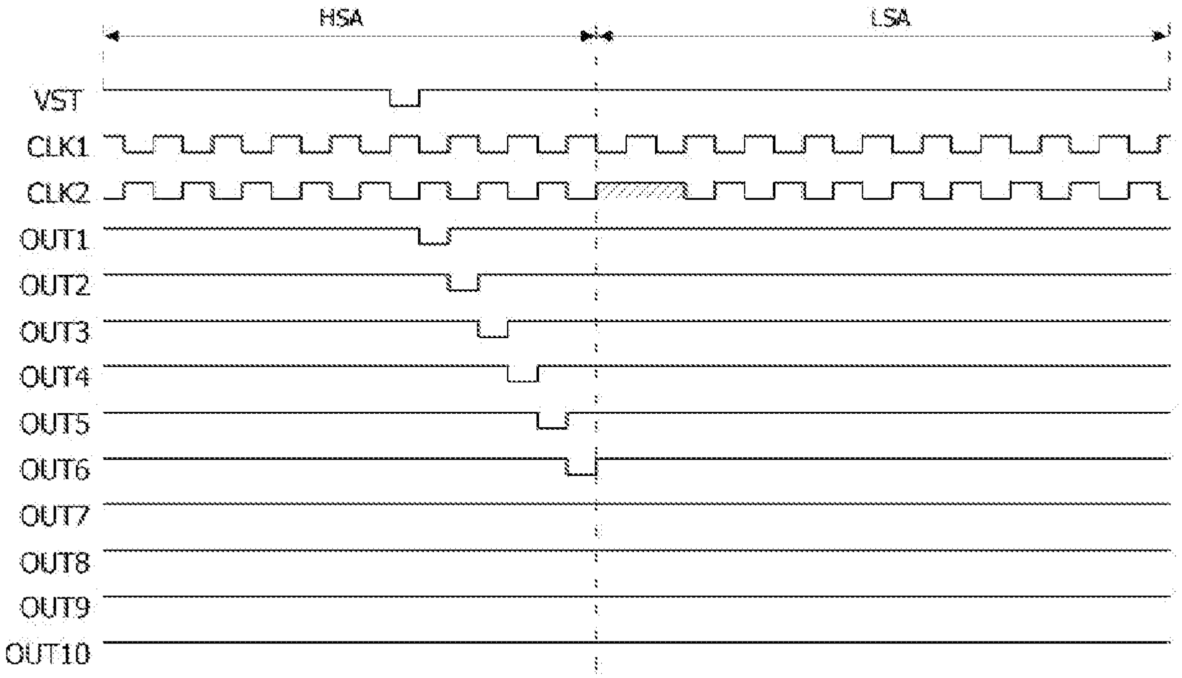
FIG. 23 is a simulation result of modulating a clock (clock signal) inputted to the circuit shown in FIG. 20.

FIG. 23 is a simulation result obtained by modulating the second clock CLK2 inputted to the circuit shown in FIG. 20.

As can be known from FIG. 23, a pulse shift of the gate signal stops when the VGH interval of the second clock CLK2 is modulated for a long time, so that the voltages of the gate signals OUT7 to OUT10 are maintained at the gate high voltage VGH in the low-speed driving area LSA.

When the scanning of the low-speed driving area LSA is started, a waveform of a gate signal outputted from a previous signal transmitter sharing the clock when a clock is modulated can be distorted. To prevent this, the shift register of the gate driver 120 to which the clock modulated in the same manner as in the above-described embodiment is inputted can divided into a left circuit and a right circuit as shown in FIGS. 24 and 25, and the gate signals can be applied to the gate lines by a single-feeding method. The left circuit applies the gate signals to the left ends of the gate lines, and the right circuit applies the gate signals to the right ends of the other gate lines.

FIGS. 24 and 25 are diagrams showing a signal transmitter of a gate driver and a clock line connection structure in single-feeding of a gate signal. The shift register shown in FIG. 24 can be applied to the signal transmitters to which a single clock is inputted as shown in FIG. 16. The shift register shown in FIG. 25 can be applied to the signal transmitters to which first and second clocks are inputted as shown in FIGS. 12 and 20.

Referring to FIG. 24, the left circuit of the gate driver 120 is disposed in a left non-display area of the display panel. The left circuit includes first and third signal transmitters ST1 and ST3. The CLK node of each of the first and third signal transmitters ST1 and ST3 is connected to the first clock line to which the first clock CLK1 is inputted. The gate signals OUT1 and OUT3 outputted from the first and third signal transmitters ST1 and ST3 are applied to the left ends of the gate lines.

The right circuit of the gate driver 120 is disposed in a right non-display area of the display panel. The right circuit includes second and fourth signal transmitters ST2 and ST4. The CLK node of each of the second and fourth signal transmitters ST2 and ST4 is connected to the second clock line to which the second clock CLK2 is inputted. The gate signals OUT2 and OUT4 outputted from the second and fourth signal transmitters ST2 and ST4 are applied to the right ends of other gate lines.

A first carry signal CAR1 outputted from the first signal transmitter ST1 is transmitted to the second signal transmitter ST2 through a first carry signal line connected to the VST node of the second signal transmitter ST2. A second carry signal CAR2 outputted from the second signal transmitter ST2 is transmitted to the third signal transmitter ST3 through a second carry signal line connected to the VST node of the third signal transmitter ST3. A third carry signal CAR3 outputted from the third signal transmitter ST3 is transmitted to the fourth signal transmitter ST4 through a third carry signal line connected to the VST node of the fourth signal transmitter ST4. A fourth carry signal CAR4 outputted from the fourth signal transmitter ST4 is transferred to the VST node of a fifth signal transmitter omitted from the drawing.

Referring to FIG. 25, the left circuit includes first, second, fifth, and seventh signal transmitters ST1, ST2, ST5, and ST7. The CLK nodes of each of the signal transmitters ST1, ST2, ST5, and ST7 are connected to a first-first clock line to which a first-first clock CLK1_L is inputted and a first-second clock line to which the first-second clock CLK2_L is inputted. The gate signals OUT1, OUT2, OUT5, and OUT7 outputted from the signal transmitters ST1, ST2, ST5, and ST7 are applied to the left ends of the gate lines.

The right circuit includes third, fourth, sixth, and eighth signal transmitters ST3, ST4, ST6, and ST8. The CLK nodes of each of the signal transmitters ST3, ST4, ST6, and ST8 are connected to a second-first clock line to which a second-first clock CLK1_R is inputted and a second-second clock line to which a second-second clock CLK2_R is inputted. The gate signals OUT3, OUT4, OUT6, and OUT8 outputted from the signal transmitters ST3, ST4, ST6, and ST8 are applied to the right ends of the gate lines.

The first carry signal CAR1 outputted from the first signal transmitter ST1 is transmitted to the second signal transmitter ST2 through the first carry signal line connected to the VST node of the second signal transmitter ST2. The second carry signal CAR2 outputted from the second signal transmitter ST2 is transmitted to the third signal transmitter ST3 through the second carry signal line connected to the VST node of the third signal transmitter ST3. The third carry signal CAR3 outputted from the third signal transmitter ST3 is transmitted to the fourth signal transmitter ST4 through the third carry signal line connected to the VST node of the fourth signal transmitter ST4. The fourth carry signal CAR4 outputted from the fourth signal transmitter ST4 is transmitted to the fifth signal transmitter ST5 through the fourth carry signal line connected to the VST node of the fifth signal transmitter ST5. The fifth carry signal CAR5 outputted from the fifth signal transmitter ST5 is transmitted to the sixth signal transmitter ST6 through a fifth carry signal line connected to the VST node of the sixth signal transmitter ST6. The sixth carry signal CAR6 outputted from the sixth signal transmitter ST6 is transmitted to the seventh signal transmitter ST7 through the sixth carry signal line connected to the VST node of the seventh signal transmitter ST7. The seventh carry signal CAR7 outputted from the seventh signal transmitter ST7 is transmitted to the eighth signal transmitter ST8 through the seventh carry signal line connected to the VST node of the eighth signal transmitter ST8. The eighth carry signal CAR8 outputted from the eighth signal transmitter ST8 is transmitted to the VST node of a ninth signal transmitter omitted from the drawing.

The objects to be achieved by the present disclosure, the means for achieving the objects, and effects of the present disclosure described above do not specify essential features of the claims, and thus, the scope of the claims is not limited to the disclosure of the present disclosure.

Although the embodiments of the present disclosure have been described in more detail with reference to the accompanying drawings, the present disclosure is not limited thereto and can be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display panel comprising:

a display area including a plurality of data lines, a plurality of gate lines, and a plurality of sub-pixels disposed on a substrate; and a gate driver configured to supply gate signals to the plurality of gate lines, wherein the display area includes:

a high-speed driving area configured to be driven at a first frequency; and a low-speed driving area configured to be driven at a second frequency being lower than the first frequency, wherein while a first image is displayed in the high-speed driving area, concurrently, a second image having a lower refresh rate than the first image is displayed in the low-speed driving area, wherein one cycle of a clock signal input to the gate driver includes a high interval with a gate high voltage and a low interval with a gate low voltage, and wherein a high interval of the clock signal is longer than a high interval of the high-speed driving area at a scanning time point of a first pixel line from which scanning of the low-speed driving area is started.

2. The display panel according to claim 1, wherein the high interval of the clock signal is same as the high interval of the high-speed driving area after the scanning time point of the first pixel line from which scanning of the low-speed driving area is started.

3. The display panel according to claim 1, wherein the gate driver is disposed in a non-display area located outside the display area.

4. A display panel comprising:

a display area including a plurality of data lines, a plurality of gate lines, and a plurality of sub-pixels disposed on a substrate; and a gate driver configured to supply gate signals to the plurality of gate lines, wherein the display area includes, a high-speed driving area configured to be driven at a first frequency; and a low-speed driving area configured to be driven at a second frequency being lower than the first frequency, wherein one cycle of a clock signal to the gate driver includes a high interval with a gate high voltage and a low interval with a gate low voltage, wherein a high interval of the clock signal is longer than a high interval of the high-speed driving area at a scanning time point of a first pixel line from which scanning of the low-speed driving area is started, wherein each of the plurality of sub-pixels includes:

a driving element including a gate electrode connected to a first node, a first electrode connected to a second node, and a second electrode connected to a third node;

a capacitor connected between a first constant voltage node to which a pixel driving voltage is applied and the first node;

a light emitting element including an anode electrode connected to a fourth node and a cathode electrode connected to a second constant voltage node to which a pixel base voltage is applied;

a first switch element including a gate electrode to which a first gate signal is applied, a first electrode connected to the first node, and a second electrode connected to the third node;

a second switch element including a gate electrode to which a second gate signal is applied, a first electrode connected to a data line, and a second electrode connected to the second node;

a third switch element including a gate electrode to which a fifth gate signal is applied, a first electrode connected to the first constant voltage node, and a second electrode connected to the second node;

a fourth switch element including a gate electrode to which the fifth gate signal is applied, a first electrode connected to the third node, and a second electrode connected to the fourth node;

a fifth switch element including a gate electrode to which a fourth gate signal is applied, a first electrode connected to the first node, and a second electrode to which a first initialization voltage is applied;

a sixth switch element including a gate electrode to which a third gate signal is applied, a first electrode connected to the fourth node, and a second electrode to which a second initialization voltage is applied; and a seventh switch element including a gate electrode to which the third gate signal is applied, a first electrode connected to the second node, and a second electrode to which an on-bias voltage is applied, and wherein the first gate signal and the fourth gate signal are configured to swing between a gate-high voltage and a gate-low voltage during a scanning period of the high-speed driving area, and are configured to maintain the gate-low voltage during a scanning period of the low-speed driving area.

5. The display panel according to claim 4, wherein the gate driver includes:

a first shift register configured to output the first gate signal;

a second shift register configured to output the second gate signal;

a third shift register configured to output the third gate signal;

a fourth shift register configured to output the fourth gate signal; and a fifth shift register configured to output the fifth gate signal, wherein each of the first to fifth shift registers includes a signal node to which a start pulse or a carry signal is inputted and a clock node to which the clock signal is inputted, and wherein the high interval of the clock signal inputted to the first and fourth shift registers is configured to maintain a previous voltage at the scanning time point of the first pixel line from which scanning of the low-speed driving area is started.

6. The display panel according to claim 5, wherein each of the first and fourth shift registers includes:

a left circuit disposed in a left non-display area of the display panel; and a right circuit disposed in a right non-display area of the display panel, wherein the left circuit includes a plurality of signal transmitters configured to include a signal node and a clock node, and output gate signals to left ends of gate lines, wherein the right circuit includes a plurality of signal transmitters configured to include a signal node and a clock node, and output gate signals to right ends of other gate lines, and wherein the carry signal is transmitted between the signal transmitters of the left circuit and the signal transmitters of the right circuit.

7. A display panel comprising:

a display area including a plurality of data lines a plurality of gate lines, and a plurality of sub-pixels disposed on a substrate; and a gate driver configured to supply gate signals to the plurality of gate lines, wherein the display area includes:

a high-speed driving area configured to be driven at a first frequency; and a low-speed driving area configured to be driven at a second frequency being lower than the first frequency, wherein one cycle of a clock signal input to the gate driver includes a high in interval with a gate high voltage low interval with a gate low voltage, wherein a high interval of the clock signal is longer than a high interval of high-speed driving area ta scanning time point of a first pixel line from which scanning of the low-speed driving area is started, wherein each of the plurality of sub-pixels includes:

a driving element including a gate electrode connected to a first node, a first electrode connected to a second node, and a second electrode connected to a third node;

a capacitor connected between a first constant voltage node to which a pixel driving voltage is applied and the first node;

a light emitting element including an anode electrode connected to a fourth node and a cathode electrode connected to a second constant voltage node to which a pixel base voltage is applied;

a first switch element including a gate electrode to which a third gate signal is applied, a first electrode connected to the first constant voltage node, and a second electrode connected to the second node;

a second switch element including a gate electrode to which a second gate signal is applied, a first electrode connected to a data line, and a second electrode connected to the second node;

a third switch element including a gate electrode to which a first gate signal is applied, a first electrode connected to the first node, and a second electrode to which an initialization voltage is applied;

a fourth switch element including a gate electrode to which the second gate signal is applied, a first electrode connected to the first node, and a second electrode connected to the third node; and a fifth switch element including a gate electrode to which the third gate signal is applied, a first electrode connected to the third node, and a second electrode connected to the fourth node, and wherein the first gate signal and the second gate signal configured to swing between a gate-high voltage and a gate-low voltage during a scanning period of the high-speed driving area, and are configured to maintain the gate-high voltage during a scanning period of the low-speed driving area.

8. The display panel according to claim 7, wherein the gate driver includes:

a first shift register configured to output the first gate signal;

a second shift register configured to output the second gate signal; and a third shift register configured to output the third gate signal, wherein each of the first to third shift registers includes a signal node to which a start pulse or a carry signal is inputted and a clock node to which the clock signal is inputted, and wherein the high interval of the clock signal inputted to the first and second shift registers is configured to maintain a previous voltage at the scanning time point of the first pixel line from which scanning of the low-speed driving area is started.

9. The display panel according to claim 8, wherein each of the first and second shift registers includes:

a left circuit disposed in a left non-display area of the display panel; and a right circuit disposed in a right non-display area of the display panel, wherein the left circuit includes a plurality of signal transmitters configured to include a signal node and a clock node, and output gate signals to left ends of gate lines, wherein the right circuit includes a plurality of signal transmitters configured to include a signal node and a clock node, and output gate signals to right ends of other gate lines, and wherein a carry signal is transmitted between the signal transmitters of the left circuit and the signal transmitters of the right circuit.

10. A display device comprising:

a display panel including a display area having data lines, gate lines, and sub-pixels disposed on a substrate, the display panel further including a gate driver configured to supply gate signals to the gate lines;

a level shifter connected to the gate driver via a plurality of clock lines to which a clock signal is applied, and a drive integrated circuit (IC) configured to supply data voltages to the data lines, wherein the display area includes:

a high-speed driving area configured to be driven at a first frequency; and a low-speed driving area configured to be driven at a second frequency being lower than the first frequency, wherein while a first image is displayed in the concurrently, a second image having a lower refresh rate than the first image is displayed in the low-speed driving area, wherein one cycle of the clock signal input to the gate driver includes a high interval with a gate high voltage and a low interval with a gate low voltage, and wherein a high interval of the clock signal is longer than a high interval of the high-speed driving area at a scanning time point of a first pixel line from which a scanning of the low-speed driving area is started.

11. The display device according to claim 10, wherein the drive IC receives control data packets and pixel data to be written to one pixel line of the display area from a host system every horizontal period, and wherein the control data packet includes an identification code indicating that pixel data to be written to the one pixel line is data in the high-speed driving area or data in the low-speed driving area.

12. The display device according to claim 10, wherein the high interval of the clock signal is same as the high interval of the high-speed driving area after the scanning time point of the first pixel line is started.

13. The display device according to claim 10, wherein the gate driver is disposed in a non-display area located outside the display area on the display panel.

14. A display device comprising:

a display including a display area having data lines, gate lines, and sub-pixels disposed on a substrate the display panel further including a gate driver configured to supply gate signals to the gate lines; and a drive integrated circuit (IC) configured to supply data voltages to the data lines, wherein the display area includes:

a high-speed driving area configured to be driven at a first frequency; and a low-speed driving area configured to be driven at a second frequency being lower than the first frequency, wherein one cycle of a clock signal input to the gate driver includes a high interval with a gate rate high voltage and a low interval with a gate low voltage, wherein a high interval of the clock signal is longer than a high interval of the high-speed driving are scanning time point of a first pixel line from which the scanning of the low-speed driving area is started, wherein each of the sub-pixels includes:

a driving element including a gate electrode connected to a first node, a first electrode connected to a second node, and a second electrode connected to a third node;

a capacitor connected between a first constant voltage node to which a pixel driving voltage is applied and the first node;

a light emitting element including an anode electrode connected to a fourth node and a cathode electrode connected to a second constant voltage node to which a pixel base voltage is applied;

a first switch element including a gate electrode to which a third gate signal is applied, a first electrode connected to the first constant voltage node, and a second electrode connected to the second node;

a second switch element including a gate electrode to which a second gate signal is applied, a first electrode connected to a data line, and a second electrode connected to the second node;

a third switch element including a gate electrode to which a first gate signal is applied, a first electrode connected to the first node, and a second electrode to which an initialization voltage is applied;

a fourth switch element including a gate electrode to which the second gate signal is applied, a first electrode connected to the first node, and a second electrode connected to the third node; and a fifth switch element including a gate electrode to which the third gate signal is applied, a first electrode connected to the third node, and a second electrode connected to the fourth node, and wherein the first gate signal and the second gate signal are configured to swing between a gate-high voltage and a gate-low voltage during a scanning period of the high-speed driving area, and are configured to maintain the gate-high voltage during a scanning period of the low-speed driving area.

15. The display device according to claim 14, wherein the gate driver includes:

a first shift register configured to output the first gate signal;

a second shift register configured to output the second gate signal; and a third shift register configured to output the third gate signal, wherein each of the first to third shift registers includes a signal node to which a start pulse or a carry signal is inputted and a clock node to which the clock signal is inputted, and wherein the high interval of the clock signal inputted to the first and second shift registers maintains a previous voltage at the scanning time point of the first pixel line from which scanning of the low-speed driving area is started.

16. The display device according to claim 15, wherein each of the first and second shift registers includes:

a left circuit disposed in a left non-display area of the display panel; and a right circuit disposed in a right non-display area of the display panel, wherein the left circuit includes a signal node and a clock node and includes a plurality of signal transmitters configured to output gate signals to left ends of gate lines, wherein the right circuit includes a signal node and a clock node and includes a plurality of signal transmitters configured to output gate signals to right ends of another gate lines, and wherein a carry signal is transmitted between the signal transmitters of the left circuit and the signal transmitters of the right circuit.

17. The display device according to claim 10, wherein during the high interval of the clock signal from the scanning time point, a gate electrode maintains the gate low voltage in the low-speed driving area.

18. A display panel comprising:

a display area including data lines, gate lines, and sub-pixels disposed on a substrate; and a gate driver configured to supply gate signals to the gate lines, wherein the display area includes:

a high-speed driving area configured to be driven at a first frequency; and a low-speed driving area configured to be driven at a second frequency being lower than the first frequency, wherein while a first image is displayed in the high-speed driving area, concurrently, a second image having a lower refresh rate than the first image is displayed in the low-speed driving area, and wherein at a scanning time point of a pixel line from which scanning of the low-speed driving area is started, a clock signal is modulated so as to increase a pulse width of the clock signal.

19. The display panel according to claim 18, wherein at the scanning time point of the pixel line from which scanning of the low-speed driving area is started, a time of the clock signal keeping a gate high voltage is longer than a time of the clock signal keeping the gate high voltage in the high-speed driving area.

* * * * *